United States Patent
Shirai

(10) Patent No.: US 6,746,195 B2
(45) Date of Patent: *Jun. 8, 2004

(54) SEMICONDUCTOR TRANSFER AND MANUFACTURING APPARATUS

(75) Inventor: Hidenobu Shirai, Kasugai (JP)

(73) Assignee: Fujitsu, Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/451,087

(22) Filed: Nov. 30, 1999

(65) Prior Publication Data

US 2004/0013497 A1 Jan. 22, 2004

(30) Foreign Application Priority Data

Dec. 1, 1998 (JP) .......................... 10-341605

(51) Int. Cl.$^7$ ................................ B65J 18/00
(52) U.S. Cl. ................ 414/217; 414/744.8; 414/935
(58) Field of Search ........ 414/744.3, 226.655, 414/217, 222.09, 217.1, 226.01, 744.1, 744.2, 744.8, 935, 936, 937, 939, 941, 222.08; 118/719

(56) References Cited

U.S. PATENT DOCUMENTS

| | | | |
|---|---|---|---|
| 4,197,772 A | * 4/1980 | Anderson et al. | 414/744.2 XL |
| 4,775,281 A | * 10/1988 | Prentakis | 414/416.03 |
| 5,000,652 A | * 3/1991 | Christensen et al. | 414/744.3 |
| 5,180,276 A | * 1/1993 | Hendrickson | 414/752.1 |
| 5,667,592 A | * 9/1997 | Boitnott et al. | 118/719 |
| 5,765,444 A | * 6/1998 | Bacchi et al. | 74/490.03 |
| 5,789,878 A | * 8/1998 | Kroeker et al. | 318/45 |
| 5,863,170 A | * 1/1999 | Boitnott et al. | 414/222.13 |
| 5,913,652 A | * 6/1999 | Zejda | 414/939 XL |
| 5,944,940 A | * 8/1999 | Toshima | 156/345.29 |
| 5,950,495 A | * 9/1999 | Ogawa et al. | 74/490.01 |
| 5,975,834 A | * 11/1999 | Ogawa et al. | 414/744.5 |
| 5,993,141 A | * 11/1999 | Wytman | 414/744.2 |
| 6,051,113 A | * 4/2000 | Molehi | 118/719 XL |
| 6,155,773 A | * 12/2000 | Ebbing et al. | 414/226.05 XL |
| 6,162,299 A | * 12/2000 | Raaijmakers | 414/937 XL |
| 6,485,250 B2 | * 11/2002 | Hofmeister | 414/744.1 |

FOREIGN PATENT DOCUMENTS

JP 10-242234 9/1998

* cited by examiner

*Primary Examiner*—Eileen D. Lillis
*Assistant Examiner*—Charles A Fox
(74) *Attorney, Agent, or Firm*—Armstrong, Kratz, Quintos, Hanson & Brooks, LLP

(57) ABSTRACT

A transfer apparatus has a transfer robot for transferring wafers between a process chamber and a pre-pressurizing chamber. The process chamber and pre-pressurizing chamber are arranged in a circle. The transfer robot has multiple arms, arranged hierarchically, for transferring the wafers. The arms are rotatable along the circle and vertically movable.

19 Claims, 30 Drawing Sheets

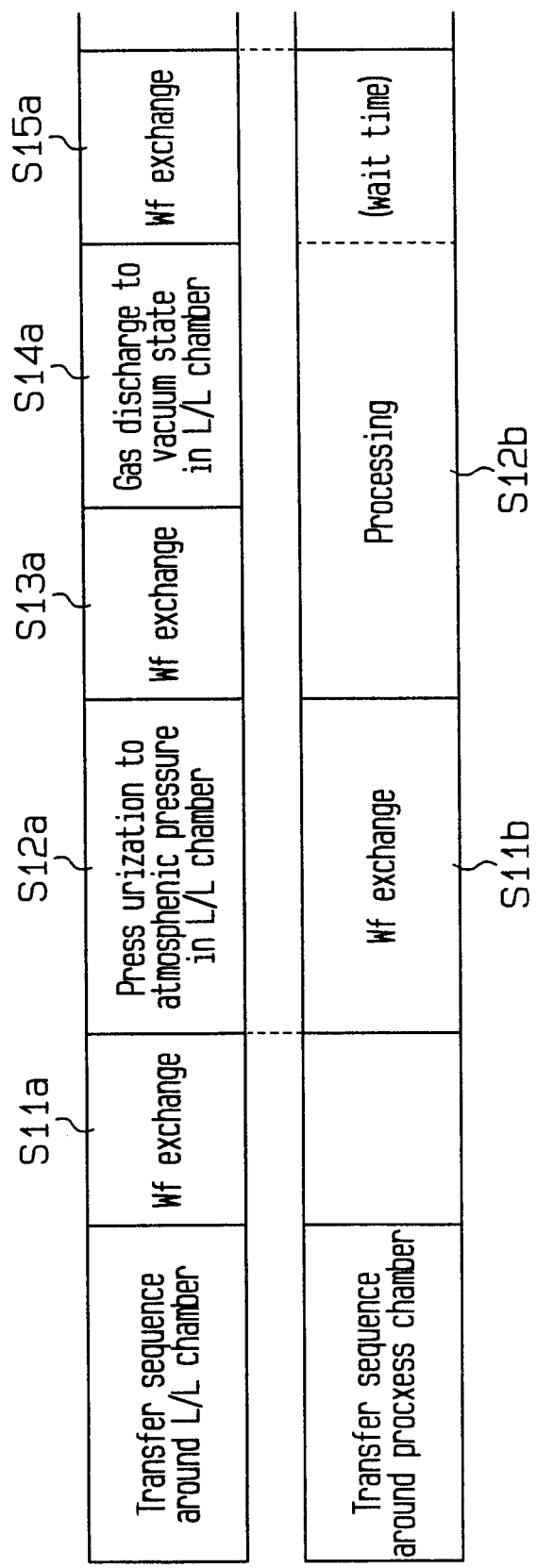

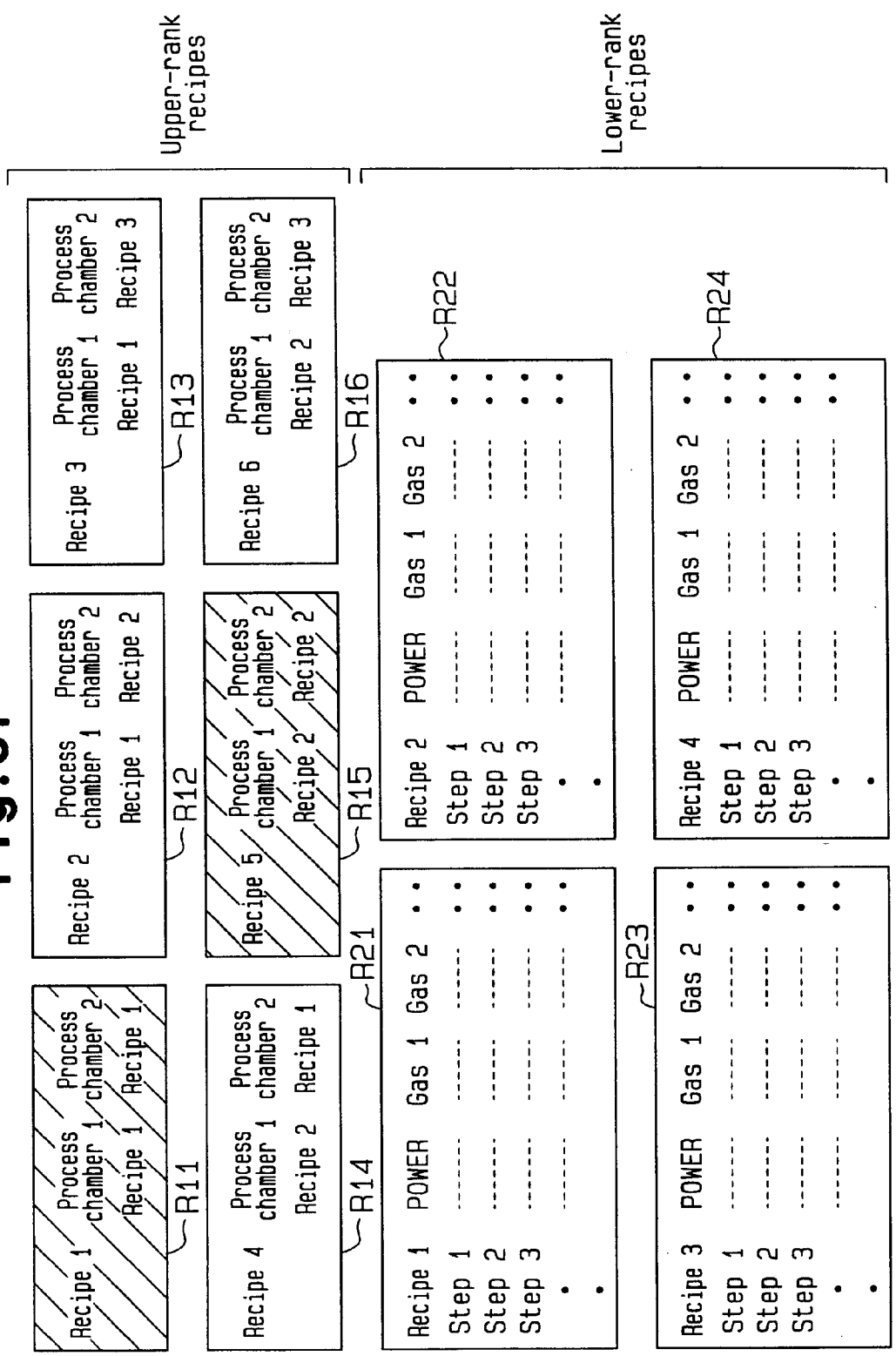

Fig. 36A

| Wf exchange | Wafer preparation before process in L/L chamber | (wait time) | Wf exchange | Wafer preparation before process in L/L chamber |
|---|---|---|---|---|
| | Processing | | | |
| | | Processing | | |

Fig. 36B

| Wf exchange | Wafer preparation before process in L/L chamber | (wait time) | Wf exchange | Wafer preparation before process in L/L chamber | (wait time) | Wf exchange |
|---|---|---|---|---|---|---|
| | First processing | | | First processing | | |
| | Second processing | | | Second processing | | |

Fig. 36C

| Wf exchange | Wafer preparation before process in L/L chamber | Wf exchange | Wafer preparation before process in L/L chamber | Wf exchange | Wafer preparation before process in L/L chamber |
|---|---|---|---|---|---|
| | First processing | | First processing | | First processing |
| | Second processing | | Second processing | | Second processing |
| | Third processing | | Third processing | | Third processing |

SEMICONDUCTOR TRANSFER AND MANUFACTURING APPARATUS

BACKGROUND OF THE INVENTION

The present invention relates to a semiconductor transfer and manufacturing apparatus, more particularly, to a semiconductor transfer and manufacturing apparatus equipped with a pressure preserving chamber (load-lock chamber), a vacuum carriage chamber and a carrier robot which transfers wafers between the outside of each apparatus in the atmosphere and a vacuum process chamber.

Recently, faster and smaller semiconductor manufacturing apparatuses are demand. For a semiconductor manufacturing apparatus having a process chamber for processing a wafer in a vacuum, particularly, there is a need for shortening both the time required to transfer wafers within the apparatus and the time required to transfer wafers between the inside and the outside of the apparatus.

FIG. 1 shows a first conventional semiconductor manufacturing apparatus 11. The semiconductor manufacturing apparatus 11 has a process chamber 12, a vacuum transfer chamber 13 and two pre-pressurizing chambers (load-lock chambers which will hereinafter be called "L/L chambers") 14 and 15. Inside the vacuum transfer chamber 13 is a vacuum. A predetermined process is performed on a workpiece or wafer W inside the process chamber 12. The wafer W is transferred to the process chamber 12 via the vacuum transfer chamber 13. The individual chambers 12 to 15 are linked to one another via isolation valves 16.

Carriers 17 and 18 for retaining the wafers W are mounted at predetermined positions in the semiconductor manufacturing apparatus 11. An external transfer robot 19 which transfers wafers W under atmospheric conditions is provided between the L/L chambers 14 and 15 and the carriers 17 and 18. The external transfer robot 19 transfers an unprocessed wafer W or a processed wafer W between the carrier 17 or 18 and the L/L chamber 14 or 15.

An internal transfer robot 20 which transfers wafers within the apparatus 11 (under vacuum) is located in the vacuum transfer chamber 13. The internal transfer robot 20 comprises a base 21, an arm section 22 and a hand section 23. The base 21, which is horizontally rotatable, supports the arm section 22. The arm section 22 has a plurality of joints and is protractable and retractable. The hand section 23 moves horizontally according to the protraction/retraction of the arm section 22. The arm section 22 is also movable up and down. The internal transfer robot 20 has three drive shafts (for vertical movement, turning movement and horizontal movement).

The hand section 23 has a pair of forks 24 on which the wafer W is placed. The internal transfer robot 20 exchanges an unprocessed wafer W placed on one fork 24 with a processed wafer W in the process chamber 12.

FIGS. 2A to 2F illustrate the wafer exchange sequence of the internal transfer robot 20. In this wafer exchange sequence, an unprocessed wafer W1 placed on one fork 24 is exchanged with a processed wafer W2 in the process chamber 12.

The internal transfer robot 20 exchanges wafers W1 and W2 in the following operational sequence.

(1) Extend the arm section 22 until an empty fork 24 reaches a predetermined position in the process chamber 12 (FIGS. 2A and 2B).

(2) Lift the arm section 22 up and place a processed wafer W2 on the fork 24. Then, retract the arm section 22 (FIGS. 2B and 2C).

(3) Turn the arm section 22 180 degrees (FIGS. 2C and 2D).

(4) Extend the arm section 22 until an unprocessed wafer W1 comes to a predetermined position in the process chamber 12 (FIG. 2E).

(5) Lower the arm section 22, place the wafer W1 in the process chamber 12 and then retract the arm section 22 (FIG. 2F).

By executing the steps (1) to (5), the internal transfer robot 20 exchanges the processed wafer W2 placed on the hand section 23, with an unprocessed wafer W1 in the L/L chamber 14 or 15. In this manner, wafers W1 and W2 are exchanged between the L/L chambers 14 and 15 and the vacuum transfer chamber 13 and between the vacuum transfer chamber 13 and the process chamber 12 in the semiconductor manufacturing apparatus 11.

That is, the single hand section 23 serves as a buffer for exchanging wafers W in this semiconductor manufacturing apparatus 11.

FIG. 3 is a schematic plan view of a second conventional semiconductor manufacturing apparatus 31. The same reference numerals are given to those components of the semiconductor manufacturing apparatus 31 which are the same as the corresponding components of the semiconductor manufacturing apparatus 11 in FIG. 1.

An internal transfer robot 32 which transfers wafers within the apparatus 31 under the vacuum condition is located in the vacuum transfer chamber 13. This internal transfer robot 32 has one more set of a drive shaft and an arm than the robot 20 in FIG. 1 in order to decrease the time required for exchanging wafers W.

That is, the internal transfer robot 32 comprises a base 33, two arms 34a and 34b, which respectively support hand sections 35a and 35b. The base 33, which is horizontally rotatable, supports the arms 34a and 34b in a vertically movable manner. The arms 34a and 34b has a plurality of joints. As the arms 34a and 34b protract and retract in accordance with the movement of the joints and the hand sections 35a and 35b each move horizontally. The internal transfer robot 32 has four drive shafts for moving the hand sections 35a and 35b, namely a single drive shaft for vertical movement, a single drive shaft for turning movement and two drive shafts for horizontal movement.

FIGS. 4A to 4D illustrate the wafer exchange sequence of the internal transfer robot 32. In this operational sequence, an unprocessed wafer W1 placed on one hand section 35b is exchanged with a processed wafer W2 in the process chamber 12 in the following steps (1) to (3).

(1) Extend the arm 34a until the empty hand section 35a reaches a predetermined position in the process chamber 12 (FIG. 4B).

(2) Lift the arm 34a up and hold the processed wafer W2. Then, retract the arm 34a. Extend the arm 34b until the unprocessed wafer W1 comes to a predetermined position in the process chamber 12 (FIG. 4C).

(3) Lower the arm 34b, place the wafer W1 in the process chamber 12 and then retract the arm 34b (FIG. 4D).

The internal transfer robot 32 simultaneously performs the operation of transferring the processed wafer W2 to the vacuum transfer chamber 13 from the process chamber 12 and the operation of transferring the unprocessed wafer W1 from the vacuum transfer chamber 13 to the process chamber 12. This makes the transfer sequence of the semiconductor manufacturing apparatus 31 faster than that of the semiconductor manufacturing apparatus 11 in FIG. 1. In addition, unlike the semiconductor manufacturing apparatus 11 in FIG. 1, the semiconductor manufacturing apparatus 31 need not turn the internal transfer robot 32.

As apparent from FIGS. 1 and 3, however, the vacuum transfer chamber 13 accommodates the internal transfer robot 20 or 32, so that the size of the site area for the vacuum transfer chamber 13 with respect to the site area of the whole semiconductor manufacturing apparatus is greater than that of each of the process chamber 12 and the L/L chambers 14 and 15. As wafers become larger, the wafer transfer distance increases. The increased transfer distance requires an increase in the arm length of the internal transfer robot, thus resulting in an increased site area for the vacuum transfer chamber 13. If the vacuum transfer chamber 13 is enlarged to accommodate an increase in the diameter of wafers, therefore, the size of the semiconductor manufacturing apparatus 11 or 31 increases significantly.

SUMMARY OF THE INVENTION

Accordingly, it is an object of the present invention to provide a semiconductor manufacturing apparatus which prevents the site area of a transfer robot from increasing to accommodate a larger wafer and improves throughput.

To achieve the above objective, the present invention provides a transfer apparatus for transferring a plurality of workpieces. The transfer apparatus includes a plurality of units and a transfer robot. The units are arranged along a predetermined imaginary circle. The transfer robot has a plurality of arms arranged hierarchically for respectively supporting the plurality of workpieces. The transfer robot transfers the workpieces to the units. The arms are rotatable along the imaginary circle and movable upward and downward.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 11 is a diagram showing a transfer sequence of the apparatus of FIG. 5;

FIG. 31 shows process performing by an apparatus of the present invention;

FIG. 36 is a diagram showing a transfer sequence in accordance with this invention.

DETAILED DESCRIPTION OF THE PREFERRED EMBODIMENTS

First Embodiment

A first embodiment of this invention will now be described referring to FIGS. 5 through 11.

Figure 5:
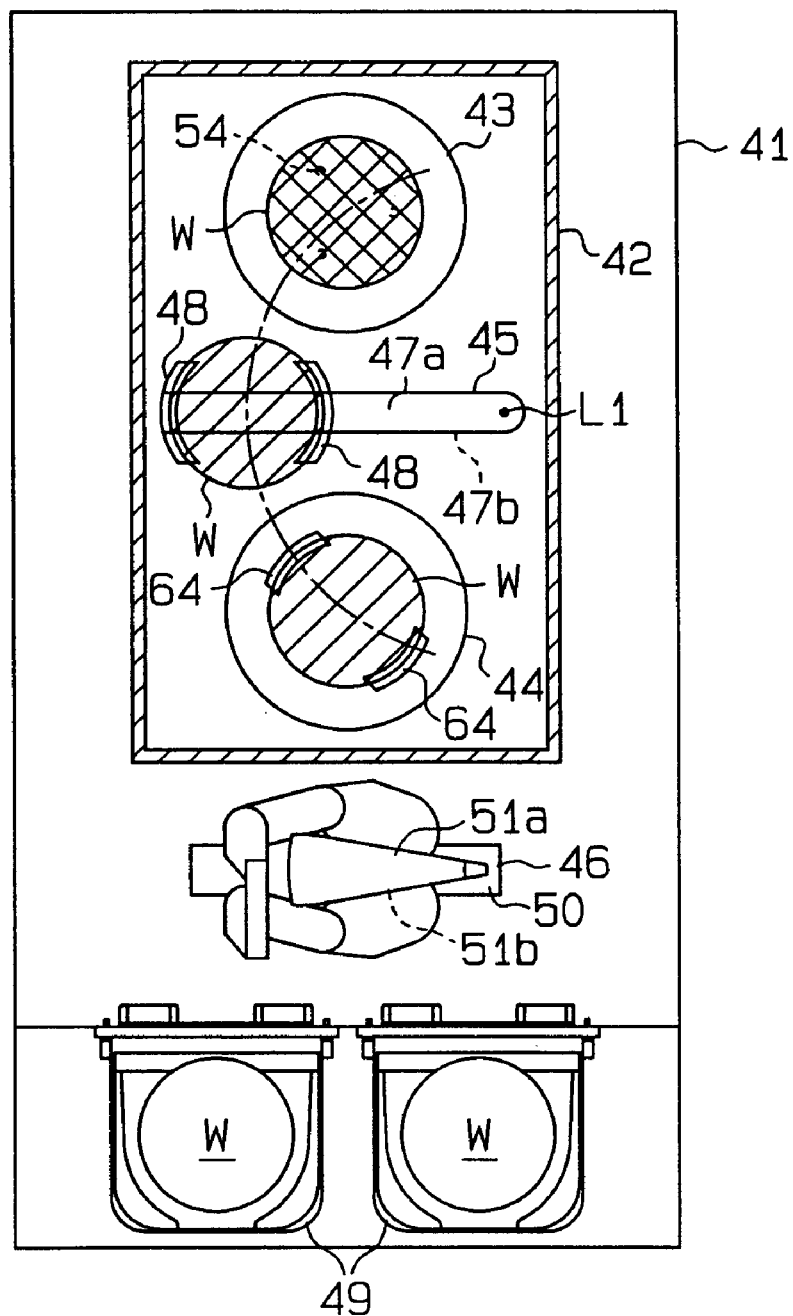
FIG. 5 is a plan view showing a semiconductor manufacturing apparatus according to a first embodiment of this invention.

As shown in FIG. 5, a semiconductor manufacturing apparatus 41 has a vacuum transfer chamber 42, a process chamber 43 and a pre-pressurizing chamber or load-lock chamber (L/L chamber) 44. The semiconductor manufacturing apparatus 41 further has an internal transfer apparatus or robot 45 and an external transfer apparatus or robot 46.

Figure 6:
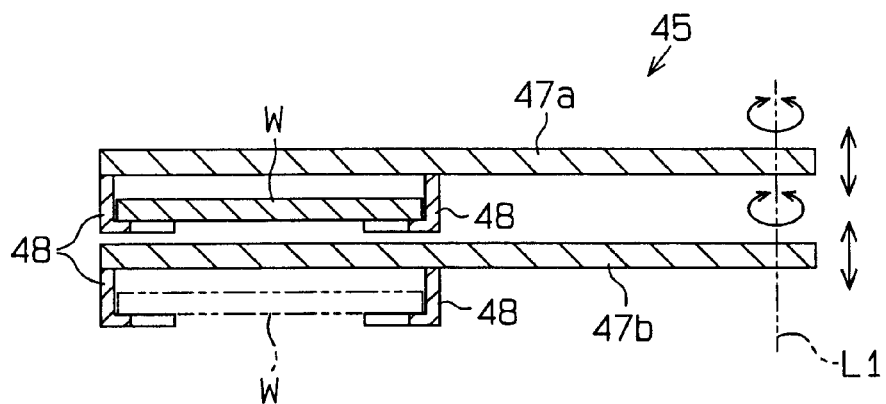
FIG. 6 is a side cross-sectional view depicting internal transfer arms of the apparatus in FIG. 5.

The vacuum transfer chamber 42 is a rectangular parallelepiped. Inside the vacuum transfer chamber 42 is a vacuum. The internal transfer robot 45 is located in the vacuum transfer chamber 42. As shown in FIG. 6, the internal transfer robot 45 has two internal transfer arms 47a and 47b arranged hierarchically. The internal transfer arms 47a and 47b are supported in such a way as to be rotatable on a horizontal plane about an axis L1 positioned near the right-hand end in the vacuum transfer chamber 42 and to be vertically movable along the axis L1. The internal transfer arms 47a and 47b are moved vertically by an unillustrated actuator, and are turned about the axis L1 independently by two unillustrated actuators for rotation.

The internal transfer arms 47a and 47b each have at least one arcuate holding piece 48 for holding a workpiece or wafer W. The internal transfer robot 45 transfers wafers W, holding a single wafer W on each of the internal transfer arms 47a and 47b.

The process chamber 43 and the L/L chamber 44 are arranged along a turning locus of the internal transfer arms 47a and 47b. The process chamber 43 and the L/L chamber 44 have approximately circular plan shapes and a wafer W is held nearly in the center of each chamber. The positions of the process chamber 43 and the L/L chamber 44 are determined in such a way that the center of the wafer W held in each chamber matches with the arcuate locus that the center of the wafer W draws as it is transferred by the associated internal transfer arm 47a or 47b.

Figure 1:
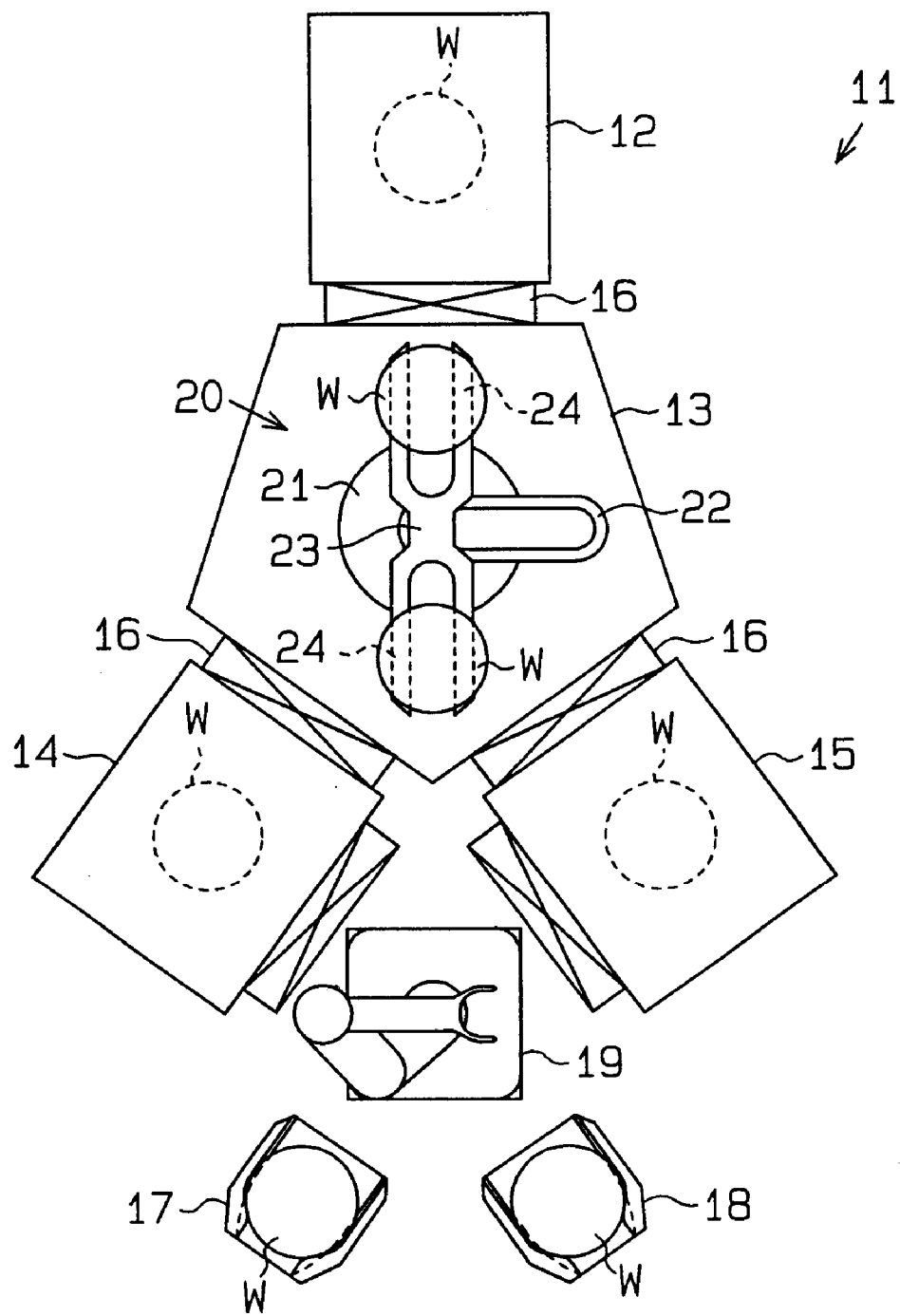
FIG. 1 is a plan view showing a first conventional semiconductor manufacturing apparatus.
Figure 2A:
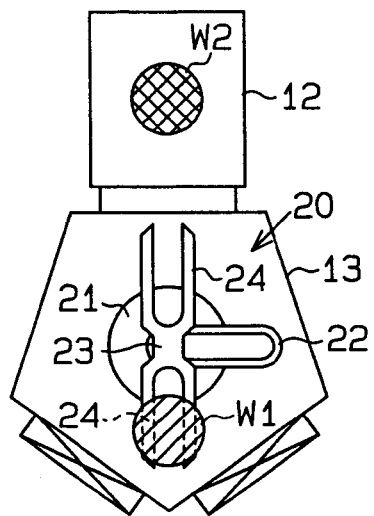
FIGS. 2A to 2F are plan views illustrating the movement of an internal transfer robot in FIG. 1.
Figure 2B:
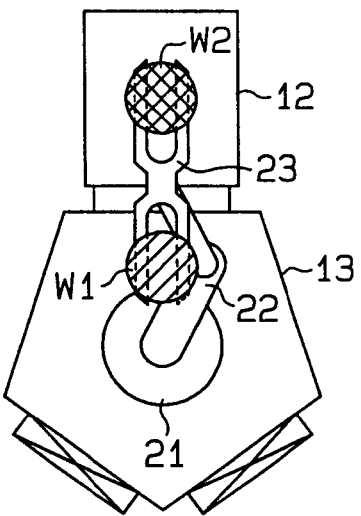
Figure 2C:
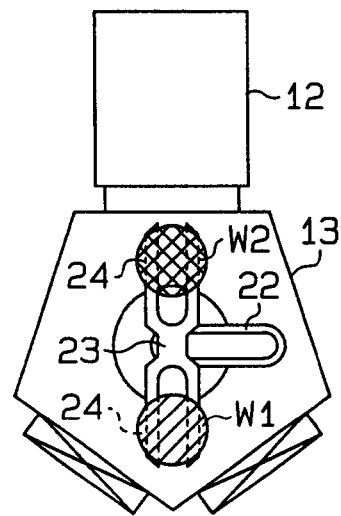
Figure 2D:
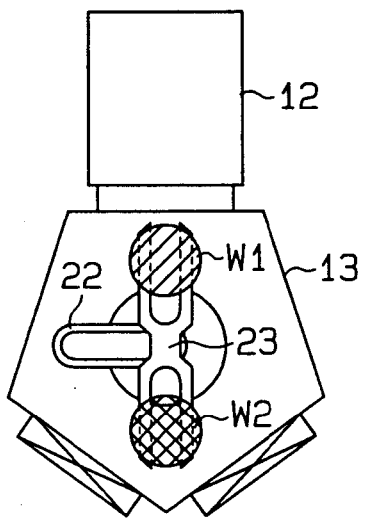
Figure 2E:
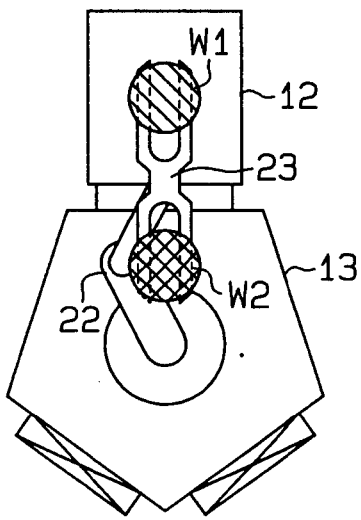
Figure 2F:
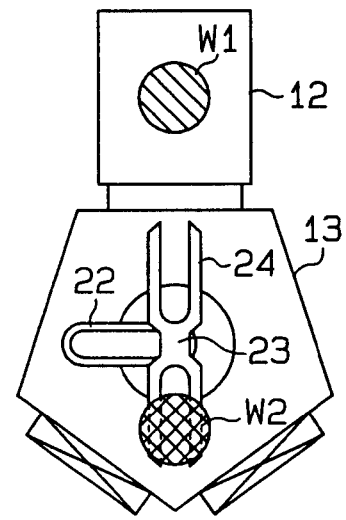

As the internal transfer arms 47a and 47b are turned and moved vertically, the wafers W are transferred between the L/L chamber 44 and the vacuum transfer chamber 42 and between the vacuum transfer chamber 42 and the process chamber 43. Unlike the conventional internal transfer robots 20 and 32 (see FIGS. 1 and 3), therefore, the entire internal transfer robot 45 need not be turned. Since the internal transfer arms 47a and 47b do not have a plurality of joints, they are easily controlled.

As shown in FIG. 5, two carriers 49 are located at predetermined locations in the semiconductor manufacturing apparatus 41. The carriers 49 retain a plurality of unprocessed wafers W lot by lot. In each carrier 49, the individual wafers W are stacked horizontally. The external transfer robot 46 transfers a wafer W between each carrier 49 and the L/L chamber 44. The external transfer robot 46 removes the unprocessed wafers W from the carriers 49 one after another and transfers them to the L/L chamber 44. The external transfer robot 46 transfers processed wafers W into the carriers 49 from the L/L chamber 44.

The external transfer robot 46 has a base 50 and two external transfer arms 51a and 51b arranged hierarchically. The external transfer arms 51a and 51b are movable along the base 50 and are rotatable on a horizontal plane. Each of the external transfer arms 51a and 51b has an arm section having a plurality of retractable joints and a hand section for holding a wafer W. The arm sections of the external transfer arms 51a and 51b are designed to be independently protractable and retractable. The protracting/retracting movements of the external transfer arms 51a and 51b permit wafers W to be exchanged without turning the external transfer arms 51a and 51b themselves. This decreases the time needed to transfer wafers W between the two carriers 49 and the L/L chamber 44.

Figure 8:
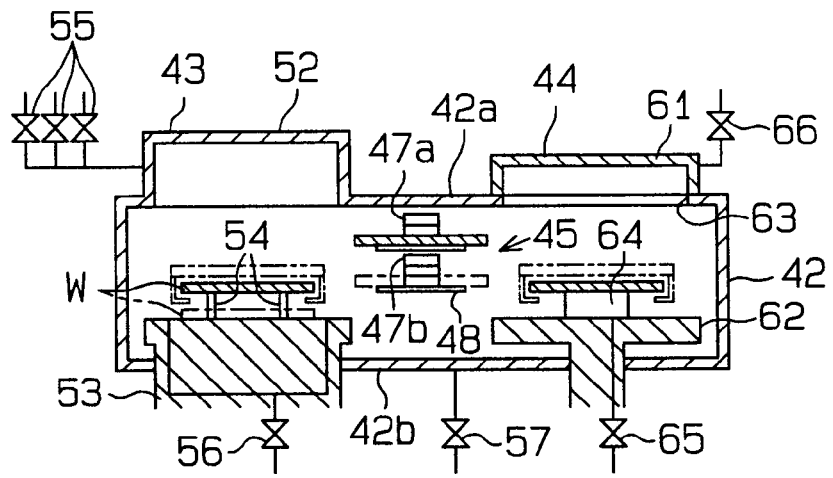
FIG. 8 is a side cross-sectional view depicting a load-lock chamber and a process chamber of the apparatus in FIG. 5.
Figure 9:
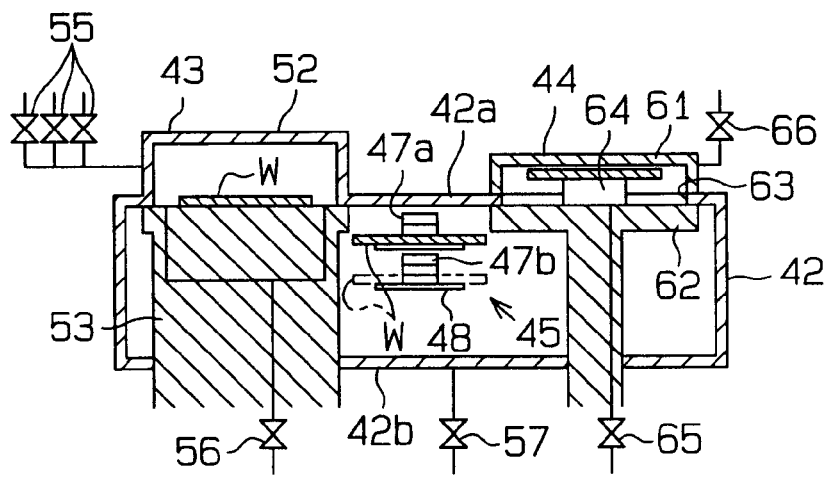
FIG. 9 is a side cross-sectional view depicting the load-lock chamber and the process chamber of the apparatus in FIG. 5.

The process chamber 43 and the L/L chamber 44 will now be discussed. FIG. 8 shows a state before transfer of wafers W to the L/L chamber 44 and the process chamber 43, and FIG. 9 shows wafers W transferred to the L/L chamber 44 and the process chamber 43.

The process chamber 43 is defined by a process-chamber hatch 52 formed integral with the top wall 42a of the vacuum transfer chamber 42 and a process-chamber stage 53. The process-chamber hatch 52 has a cylindrical shape with a top and has an inside diameter and height sufficient for processing a wafer W.

The process-chamber stage 53 is located inside the vacuum transfer chamber 42 via a circular insertion hole formed in the bottom wall 42b of the vacuum transfer chamber 42. The process-chamber stage 53 has a generally columnar shape whose diameter is about the same as the inside diameter of the process-chamber hatch 52. The process-chamber stage 53 is moved up and down by an unillustrated actuator. When the process-chamber stage 53 is moved to the position shown in FIG. 9 by the actuator, the top surface of the process-chamber stage 53 abuts the bottom surface of the top wall 42a, thereby tightly closing the process chamber 43. The position of the process-chamber stage 53 then is called a "close position". The process-chamber stage 53 can be moved down to the position where it does not interfere with the rotational movement of the internal transfer arms 47a and 47b. The position of the process-chamber stage 53 then is called a "transfer position".

A lift pin 54 provided on the process-chamber stage 53 is moved up and down by an unillustrated actuator. The lift pin 54 is provided at such a position as not to interfere with the transfer of wafers W by the internal transfer arms 47a and 47b. As the lift pin 54 is lifted to a predetermined height from the top surface of the process-chamber stage 53, it receives a wafer W from the internal transfer arm 47a or 47b.

When the lift pin 54 is moved down, the wafer W supported on the lift pin 54 is placed on the process-chamber stage 53 as indicated by a two-dot chain line in FIG. 8. The process-chamber stage 53 is moved up to the close position. Then, a predetermined process is performed on the top surface of the wafer W in the process chamber 43.

The process chamber 43 is provided with a plurality of gas valves 55 and an exhaust valve 56. Each gas valve 55 is connected to the process-chamber hatch 52. Various gases necessary for processing the wafer W in the process chamber 43 are fed via the gas valves 55. The gas valves 55 are selectively opened and closed in accordance with a processing step. The exhaust valve 56 is connected to a passage formed in the process-chamber stage 53. As the exhaust valve 56 is opened, the gas inside the process chamber 43 is discharged so that the inside of the process chamber 43 becomes a vacuum.

As shown in FIGS. 8 and 9, the vacuum transfer chamber 42 is connected to an unillustrated vacuum pump via an exhaust valve 57. As the exhaust valve 57 is opened, the gas inside the vacuum transfer chamber 42 is discharged so that the inside of the vacuum transfer chamber 42 becomes a vacuum.

The L/L chamber 44 is defined by an L/L hatch 61 and an L/L stage 62 which are arranged with the top wall 42a of the vacuum transfer chamber 42 in between. Formed in the top wall 42a is a passage 63 which connects the interior of the vacuum transfer chamber 42 to the area above the chamber 42. The passage 63 has a circular shape whose inside diameter is approximately the same as the inside diameter of the process-chamber hatch 52. The passage 63 is located on the locus that is drawn by the centers of wafers W transferred by the internal transfer arms 47a and 47b. The wafers W can pass through the passage 63 vertically while being positioned horizontally.

Like the process-chamber hatch 52, the L/L hatch 61 has a cylindrical shape with a top. The L/L hatch 61 has an inside diameter approximately the same as the inside diameter of the process-chamber hatch 52 and is high enough to retain a wafer W which has been transferred.

The L/L hatch 61 is so supported as to be movable upward by an unillustrated actuator. As this actuator is driven, the L/L hatch 61 is shifted between an unillustrated transfer position (upper position) and a close position (lower position) shown in FIGS. 8 and 9. With the L/L hatch 61 moved to the transfer position, the external transfer arms 51a and 51b do not contact the L/L hatch 61 and can move under the L/L hatch 61. At the close position, the L/L hatch 61 closes the passage 63.

The L/L stage 62 is formed in a disk shape having an outside diameter such as to be able to close the passage 63 formed in the top wall 42a. The L/L stage 62 is supported on a support which is inserted in the vacuum transfer chamber 42 from below through a circular insertion hole formed in the bottom wall 42b of the vacuum transfer chamber 42. The support is moved upward or downward as an unillustrated actuator is driven. The L/L stage 62 is therefore vertically movable in the vacuum transfer chamber 42. The position of the L/L stage 62 is switched between the transfer position shown in FIG. 8 and the close position shown in FIG. 9.

At the close position, the L/L stage 62 closes the passage 63 and does not interfere with the rotational movement of the internal transfer arms 47a and 47b.

A wafer holder 64 is provided on the top surface of the L/L stage 62 and holds a wafer W at a predetermined height from the top surface of the L/L stage 62. The wafer holder 64 has a shape which does not interfere with the external transfer arms 51a and 51b and the internal transfer arms 47a and 47b. When the L/L stage 62 is at the transfer position shown in FIG. 8, wafers W are transferred between the L/L stage 62 and the process chamber 43 by the internal transfer arms 47a and 47b. When the L/L stage 62 is at the close position shown in FIG. 9, wafers W are transferred between the L/L stage 62 and the carriers 49 by the external transfer arms 51a and 51b.

With the L/L stage 62 at the close position, the external transfer arms 51a and 51b (see FIG. 5) can receive a wafer W held by the wafer holder 64. With the L/L stage 62 at the transfer position, the internal transfer arms 47a and 47b can receive a wafer W held by the wafer holder 64.

A purge valve 66 is connected via a pipe to the L/L hatch 61. An exhaust valve 65 is connected to a pipe passage provided in the L/L stage 62. The passage 63 is closed by the L/L hatch 61 and the L/L stage 62 which are positioned at the close position. When the exhaust valve 65 is opened in this state, the passage 63 and the L/L hatch 61 are pumped down to a vacuum state inside by the unillustrated vacuum pump.

When the L/L stage 62 is moved down to the transfer position, the wafer W held by the wafer holder 64 is transferred into the vacuum transfer chamber 42 in a vacuum state. The wafer W is picked up by the internal transfer arm 47a (47b) and carried into the process chamber 43 (FIG. 5). The wafer W on the arm 47b (47a) is placed on the wafer holder 64 and is carried into the passage 63 as the L/L stage 62 is moved upward. At this time, since the passage 63 is closed by the L/L hatch 61, the interior of the vacuum transfer chamber 42 is kept in a vacuum state.

When the purge valve 66 is opened with the passage 63 closed by the L/L hatch 61 and the L/L stage 62, a nitrogen gas is supplied to the L/L chamber 44 from an unillustrated gas source. The supply of nitrogen gas increases the pressures in the L/L hatch 61 and the passage 63 nearly to atmospheric pressure. When the L/L hatch 61 is shifted to the transfer position, the wafer W held by the wafer holder 64 of the L/L stage 62 is held by the external transfer arm 51a (51b). The wafer W held by the external transfer arm 51b (51a), on the other hand, is placed on the wafer holder 64 of the L/L stage 62 which is at the transfer position. Since the lower portion of the passage 63 is closed by the L/L stage 62 at this time, the insides of the vacuum transfer chamber 42 and the process chamber 43 are kept in a vacuum state.

In other words, when the L/L stage 62 and the L/L hatch 61 are moved to the transfer position, the L/L stage 62 closes the passage 63 and the upper portion of the L/L stage 62 is released, so that the wafer W can be transferred under the atmospheric state while keeping the inside of the vacuum transfer chamber 42 in a vacuum state. When the L/L stage 62 and the L/L hatch 61 are moved to the close position, on the other hand, the L/L hatch 61 closes the passage 63 so that the wafer W can be transferred into the vacuum transfer chamber 42 while keeping the L/L chamber 44 in a vacuum state. In this semiconductor manufacturing apparatus 41, the passage 63, the L/L hatch 61 and the L/L stage 62 constitute the L/L chamber 44 as a pre-pressurizing chamber. The L/L chamber 44 allows wafers W to be transferred between the carriers 49 and the vacuum transfer chamber 42 without opening the process chamber 43 to the atmosphere.

Figure 7:
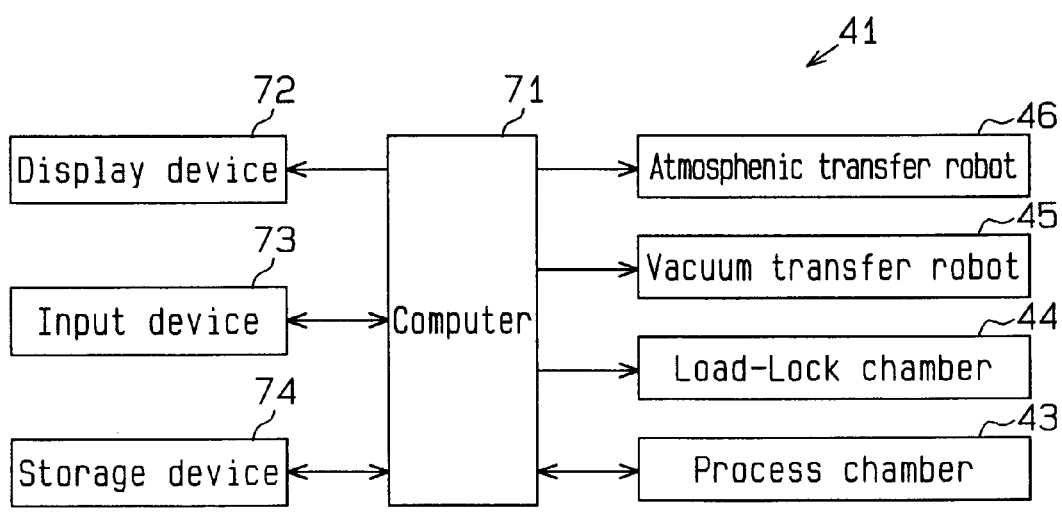
FIG. 7 is a block diagram showing an electric circuit of the semiconductor manufacturing apparatus of FIG. 6.

As shown in FIG. 7, the semiconductor manufacturing apparatus 41 includes a computer 71 as its core. The computer 71 is connected to a display device 72, an input device 73, a storage device 74, the external transfer robot 46 and the internal transfer robot 45. The computer 71 is also connected to various actuators and various valves 55–57, 65 and 66 (see FIGS. 8 and 9) for the L/L chamber 44 and the process chamber 43.

The storage device 74 stores recipes or process steps for manufacturing wafers W. The recipes comprises process program codes associated with process sequences in the process chamber 43 and control parameters (control target values such as the temperature, the pressure, the type of gas, the flow rate of gas and the time). The computer 71 controls both robots 45 and 46, and the various actuators and various valves 55–57, 65 and 66 for the L/L chamber 44 and the process chamber 43 in accordance with the process program codes described in the recipes.

The transfer operation of the internal transfer robot 45 will now be discussed with reference to FIGS. 10A–10D.

Figure 10A:
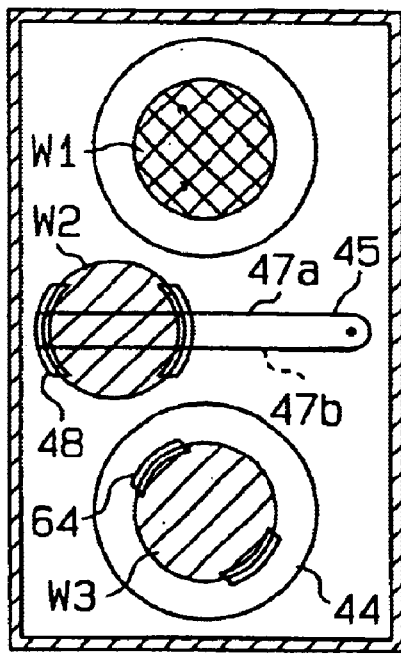
FIGS. 10A to 10D are schematic plan views illustrating the movements of the internal transfer arms of the apparatus in FIG. 5.

FIGS. 10A to 10D illustrate the movements of the internal transfer arms 47a and 47b for exchanging a wafer W1 in the process chamber 43 with an unprocessed wafer W2. In FIG. 10A, the processed wafer W1 is held by the lift pin 54 in the process chamber 43, and the unprocessed wafer W2 is held by the lower internal transfer robot 47b of the internal transfer robot 45. A wafer W3 which is to be processed next to the wafer W2 is held by the wafer holder 64 in the L/L chamber 44.

The computer 71 exchanges the processed wafer W1 with the unprocessed wafer W2 according to the following steps (11) to (13).

Figure 10B:
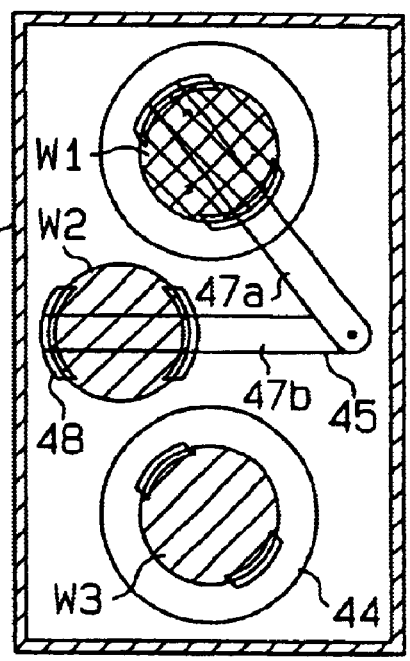

(11) The computer 71 moves the process-chamber stage 53 to the transfer position shown in FIG. 8. Then, the computer 71 turns the upper internal transfer arm 47a of the internal transfer robot 45 to an exchange position where the wafer W1 in the process chamber 43 is to be held (FIGS. 10A and 10B).

Figure 10C:
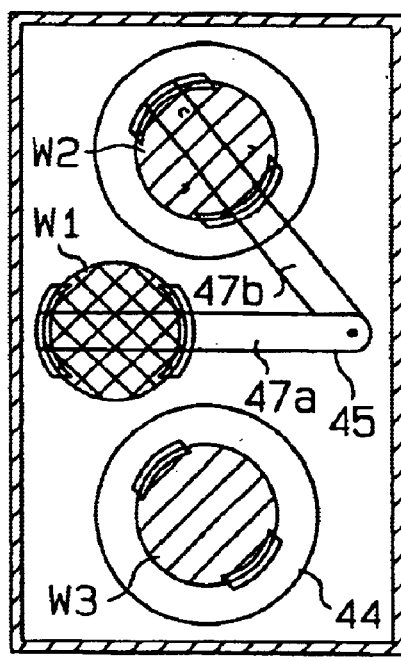

(12) As shown in FIG. 10C, the computer 71 simultaneously drives the upper and lower internal transfer arms 47a and 47b to exchange the wafer W1 in the process chamber 43 with the unprocessed wafer W2. That is, the computer 71 moves the upper internal transfer arm 47a upward and causes the arm 47a to hold the processed wafer W1. Next, the computer 71 turns the upper internal transfer arm 47a holding the processed wafer W1 to a buffer position between the process chamber 43 and the L/L chamber 44. At the same time as turning the upper internal transfer arm 47a, the computer 71 turns the lower internal transfer arm 47b holding the unprocessed wafer W2 to the exchange position on the process chamber 43 side from the buffer position.

Figure 10D:
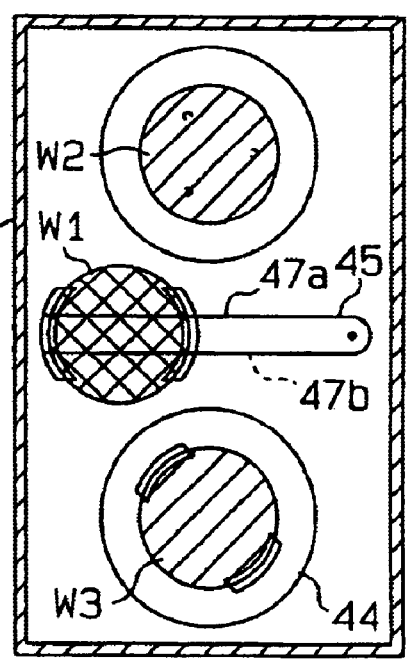

(13) The computer 71 moves the lower internal transfer arm 47b down and places the wafer W2 on the lift pin 54 in the process chamber 43, then turns the lower internal transfer arm 47b to the buffer position (FIG. 10D).

Through the above steps, the computer 71 exchanges the processed wafer W1 in the process chamber 43 with the unprocessed wafer W2 in the vacuum transfer chamber 42. Thereafter, the computer 71 moves the process-chamber stage 53 upward. Then, the computer 71 initiates a wafer process on the unprocessed wafer W2 according to the recipes.

In a transfer sequence similar to the one just discussed for the process chamber 43, the computer 71 exchanges the unprocessed wafer W3 held by the wafer holder 64 in the L/L chamber 44 with the processed wafer W1 held by the upper internal transfer arm 47a. That is, the computer 71 exchanges the processed wafer W2 in the vacuum transfer chamber 42 with the unprocessed wafer W3 in the L/L chamber 44 in the same way as the above-described transfer sequence.

Next, the wafer transfer operation by the semiconductor manufacturing apparatus 41 will be described according to a transfer sequence shown in FIG. 11.

It is assumed here that an unprocessed wafer W is retained in the L/L chamber 44 and the upper internal transfer arm 47a of the internal transfer robot 45 is holding a processed wafer W. It is also assumed that a process on a wafer W is under way in the process chamber 43. It is further assumed that the first external transfer arm 51a of the external transfer robot 46 is holding an unprocessed wafer W which has been taken out of the carrier 49.

The computer 71 performs wafer transfer via the L/L chamber 44 according to steps S11a to S15a in FIG. 11, and performs wafer transfer via the process chamber 43 according to steps S11b and S12b.

First, the computer 71 carries out a "Wf exchange step" in the L/L chamber 44 (step S11a). In the Wf exchange step, the lower internal transfer arm 47b receives the unprocessed wafer W retained in the L/L chamber 44. The processed wafer W held by the upper internal transfer arm 47a is placed on the wafer holder 64 in the L/L chamber 44.

Next, the computer 71 opens the purge valve 66 to feed the nitrogen gas into the L/L chamber 44 to make the pressure in the L/L chamber 44 nearly equal to the atmospheric pressure (step S12a). By this time, the process on the wafer W in the process chamber 43 has already been completed. At the same time, the computer 71 performs a "Wf exchange step" in the process chamber 43 (step S11b). In this step, the computer 71 exchanges the unprocessed wafer W held by the lower internal transfer arm 47b with the processed wafer W in the process chamber 43 according to the sequence in FIGS. 10A to 10D. Then, the computer 71 performs a predetermined process on the wafer W retained in the process chamber 43 (step S12b).

After the pressure in the L/L chamber 44 rises nearly to the atmospheric pressure, the computer 71 performs a "Wf exchange step" in the L/L chamber 44 under atmospheric pressure (step S13a). In this step, the computer 71 exchanges the unprocessed wafer W held by the first external transfer arm 51a with the processed wafer W in the L/L chamber 44.

When the exchange is completed, the computer 71 manipulates the exhaust valve 65 to discharge the gas out of the L/L chamber 44 and set the L/L chamber 44 in a vacuum state (step S14a). When the inside of the L/L chamber 44 becomes a vacuum state, the computer 71 executes a "Wf exchange step" in the L/L chamber 44 in a manner similar to that of step S11a. That is, the computer 71 exchanges the unprocessed wafer W in the L/L chamber 44 with the processed wafer W that the lower internal transfer arm 47b has received in step S11b.

When the time needed for wafer processing is short, therefore, the "Wf exchange step" in the process chamber 43 will not be carried out until the "Wf exchange step" in step S15a is finished. That is, it is the wait time from the point of completion of the wafer processing in step S12b to the point where exchange of wafers W becomes possible.

The first embodiment has the following advantages.

(1) The semiconductor manufacturing apparatus 41 has the internal transfer robot 45 which transfers wafers W by the rotational and vertical movements of the internal transfer arms 47a and 47b. The process chamber 43 and L/L chamber 44 are arranged on the rotational locus of the internal transfer arms 47a and 47b. As a result, the vacuum transfer chamber 42 only has a size large enough to permit the rotation of the internal transfer arms 47a and 47b. It is thus possible to make the site area or footprint of the vacuum transfer chamber 42 smaller than that of the prior art.

Figure 3:
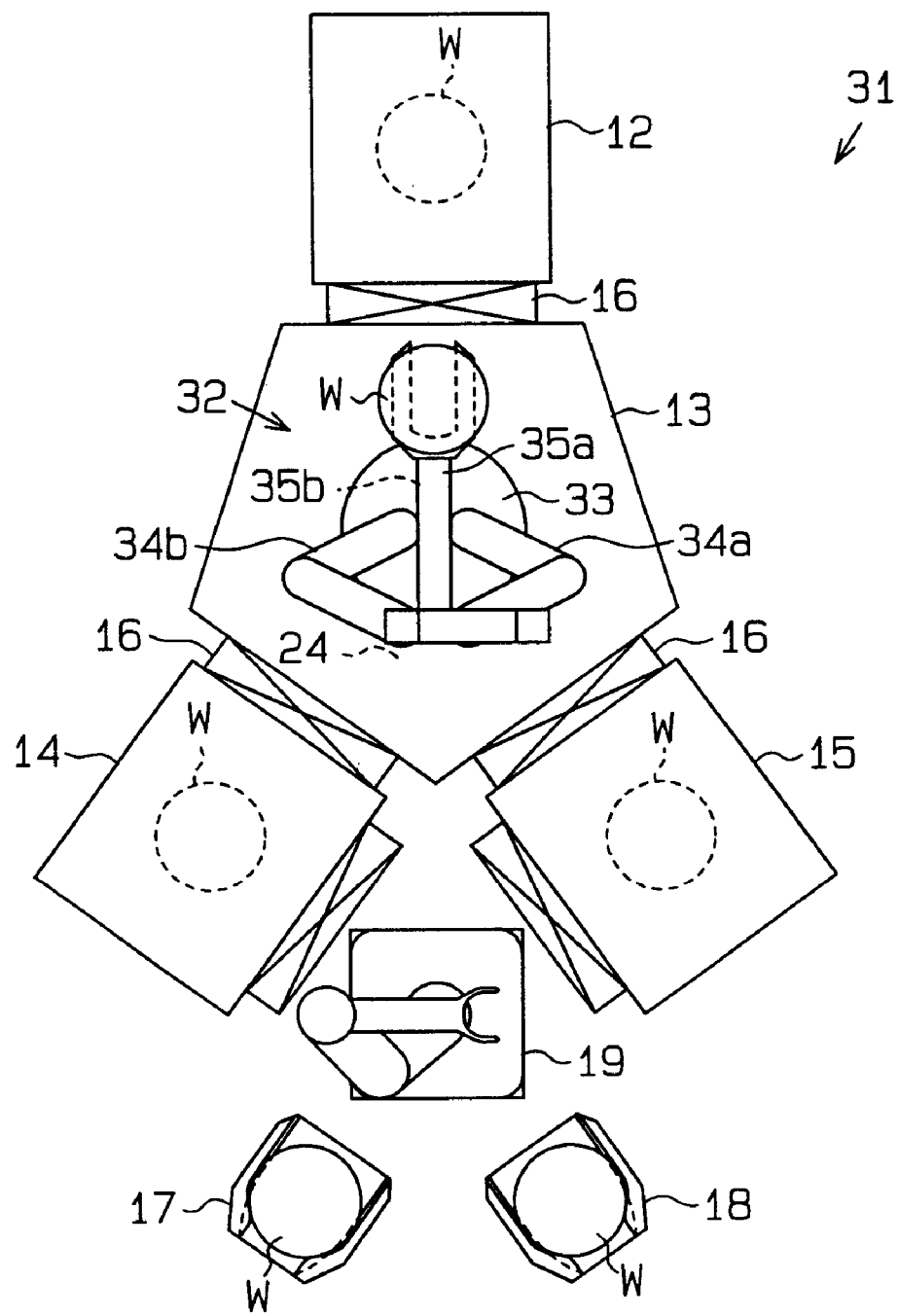
FIG. 3 is a plan view showing a second conventional semiconductor manufacturing apparatus.
Figure 4A:
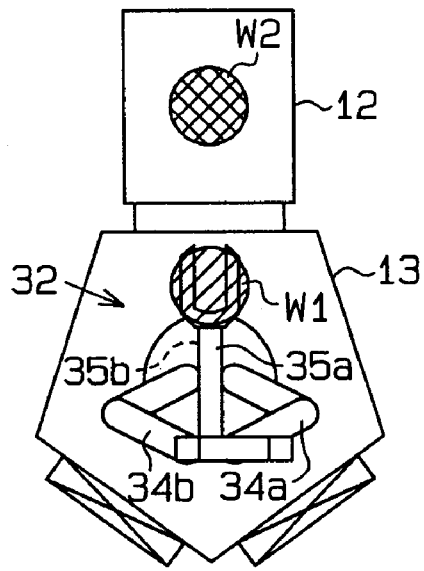
FIGS. 4A to 4D are schematic plan views illustrating the movement of an internal transfer robot in FIG. 3.
Figure 4B:
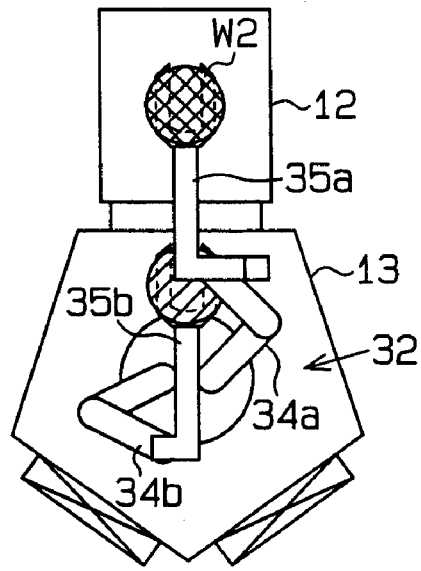
Figure 4C:
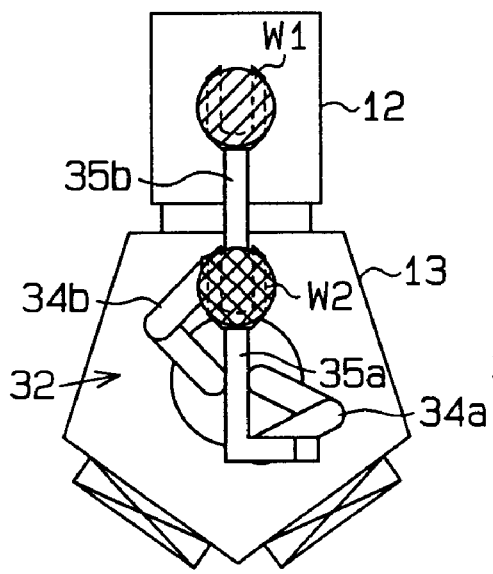
Figure 4D:
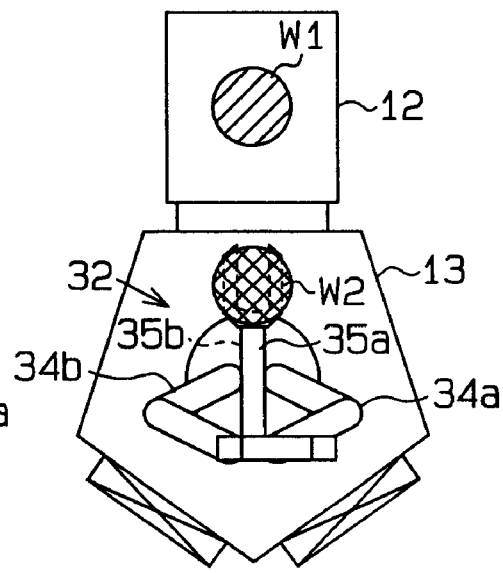

(2) The semiconductor manufacturing apparatus 41 transfers wafers W in the same number of steps as those of the transfer sequence of the conventional apparatus 31 shown in FIG. 3. Unlike the conventional apparatuses 11 and 31, the semiconductor manufacturing apparatus 41 need not rotate the internal transfer robot 45 to change the transfer direction in order to start the transfer sequence for wafer exchange. The throughput of the semiconductor manufacturing apparatus 41 is therefore higher than those of the conventional apparatuses 11 and 31.

(3) The operations that the semiconductor manufacturing apparatus 41 carries out to transfer wafers W are simple rotation and up-and-down elevation, and the protraction and retraction of the internal transfer arms 47a and 47b needed in the conventional transfer sequences illustrated in FIGS. 2 and 4 are not necessary. This simplifies the control for the transfer sequence. Although the semiconductor manufacturing apparatus 41 has fewer drive shafts by one than the conventional apparatuses 11 and 31, it can demonstrate the same functions as the conventional ones.

Second to seventh embodiments of this invention will be described below. The same reference numerals are given to those components which are the same as the aforementioned components of the first embodiment.

Second Embodiment

Figure 12:
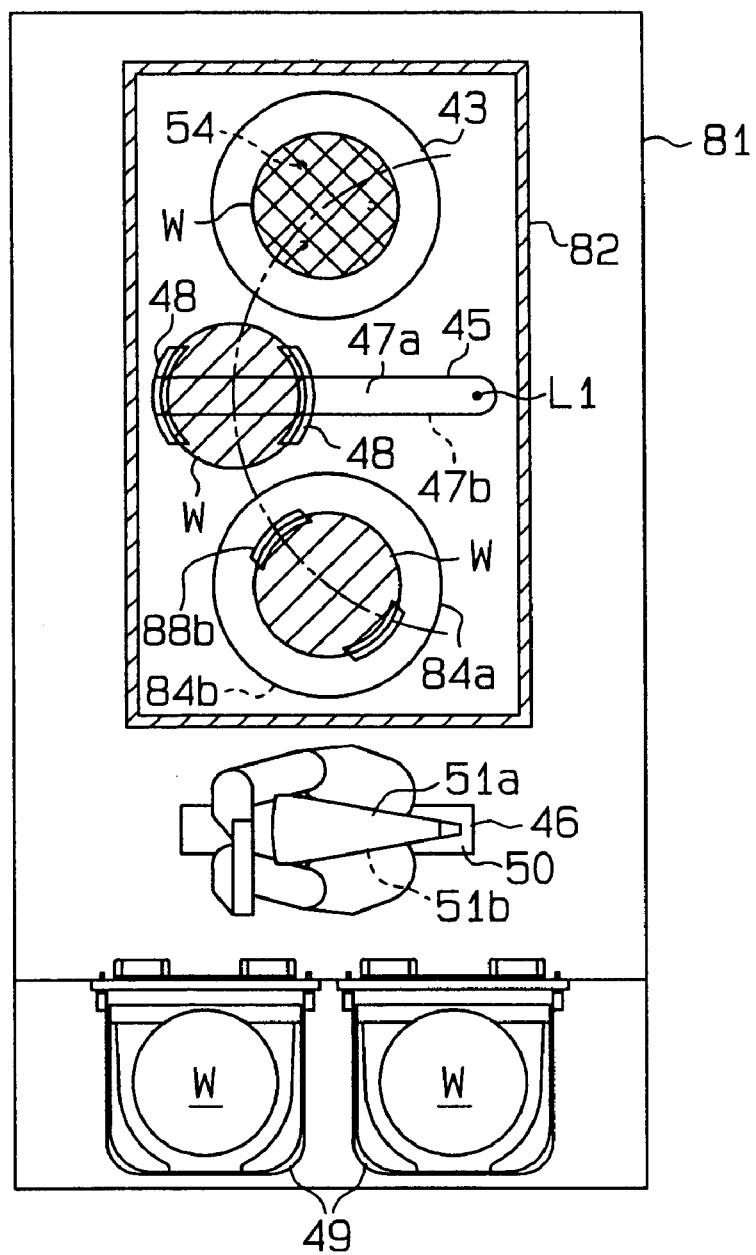
FIG. 12 is a plan view showing a semiconductor manufacturing apparatus according to a second embodiment of this invention.

As shown in FIG. 12, a semiconductor manufacturing apparatus 81 according to a second embodiment has a vacuum transfer chamber 82, a process chamber 43 and two pre-pressurizing chambers (load-lock (L/L) chambers) 84a and 84b. The semiconductor manufacturing apparatus 81 further has an internal transfer robot 45 and an external transfer robot 46.

The vacuum transfer chamber 82 is a rectangular parallelepiped. The internal transfer robot 45 is located in nearly the center of the vacuum transfer chamber 82. The internal transfer robot 45 has two internal transfer arms 47a and 47b arranged hierarchically. The arms 47a and 47b are rotatable on a horizontal plane about an axis L1 positioned on the right-hand side in the vacuum transfer chamber 82 in FIG. 12. The arms 47a and 47b are further vertically movable along the axis L1 (see FIG. 6).

Figure 13:
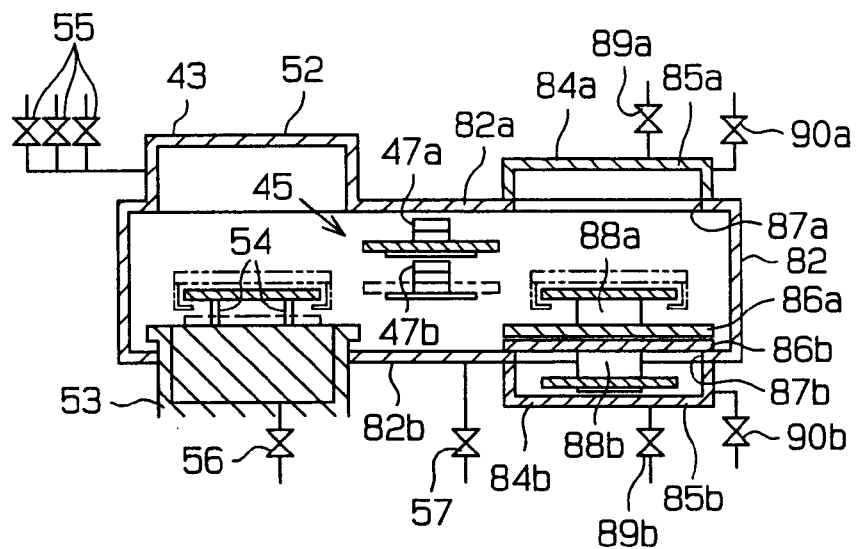
FIG. 13 is a side cross-sectional view depicting a load-lock chamber and a process chamber of the apparatus in FIG. 12.
Figure 14:
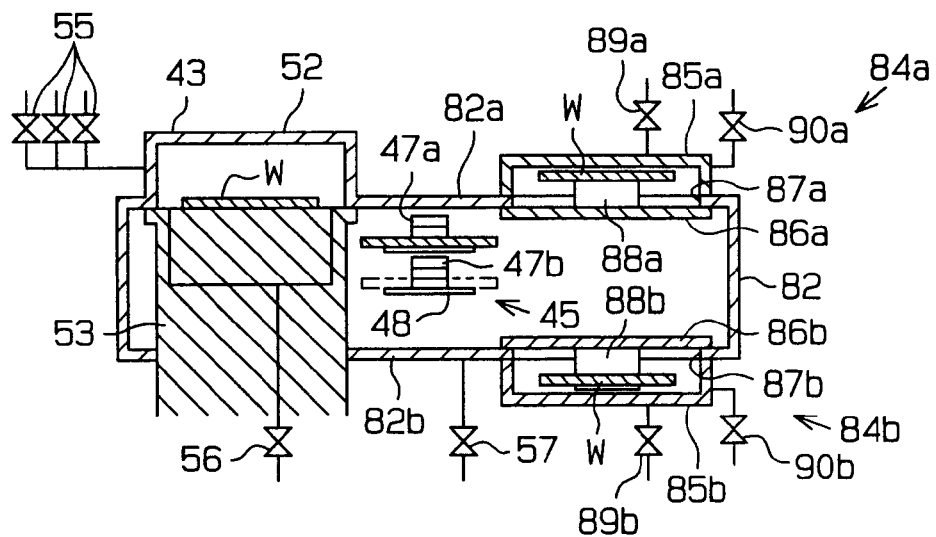
FIG. 14 is another side cross-sectional view depicting the load-lock chamber and the process chamber of the apparatus in FIG. 12.

As shown in FIGS. 13 and 14, the process chamber 43, the upper L/L chamber 84a and the lower L/L chamber 84b are located on the rotational locus of the internal transfer arms 47a and 47b. The lower L/L chamber 84b is located under the upper L/L chamber 84a. The site area or footprint of the L/L chambers 84a and 84b in the second embodiment is smaller than that of the L/L chambers 14 and 15 of the conventional semiconductor manufacturing apparatus 11 or 31 shown in FIG. 1 or 3.

The internal transfer robot 45 transfers wafers W between the L/L chambers 84a and 84b and the vacuum transfer chamber 82 and between the vacuum transfer chamber 82 and the process chamber 43 only by the rotational and vertical movements of the internal transfer arms 47a and 47b, as per the first embodiment. Unlike the conventional internal transfer robots 20 and 32 (see FIGS. 1 and 3), therefore, the whole internal transfer robot 45 need not be rotated. As the internal transfer arms 47a and 47b do not have a plurality of joints, they are easily controlled.

The structures of the L/L chambers 84a and 84b will be discussed below.

The upper L/L chamber 84a, like the L/L chamber 44 in the first embodiment, is positioned above the vacuum transfer chamber 82. This upper L/L chamber 84a includes an upper L/L hatch 85a and an upper L/L stage 86a. The upper hatch 85a and the upper stage 86a are arranged with the top wall 82a of the vacuum transfer chamber 82 in between.

Formed in the top wall 82a is an upper passage 87a which connects the inside and outside of the vacuum transfer chamber 82 to each other. The upper passage 87a has a circular shape whose center matches with a predetermined point on the locus that is drawn by the centers of wafers W transferred by the internal transfer arms 47a and 47b. The inside diameter of the upper passage 87a is approximately the same as that of the process-chamber hatch 52, which is greater than the diameter of the wafers W.

The upper hatch 85a has a cylindrical shape with a top which is similar to the shape of the process-chamber hatch 52. The upper hatch 85a has an inside diameter approximately the same as that of the process-chamber hatch 52 and is high enough to retain a wafer W which has been transferred.

The upper hatch 85a is movable upward by an unillustrated actuator, so that the upper hatch 85a can be shifted between a transfer position (not shown) and a close position shown in FIGS. 13 and 14. With the upper hatch 85a at the transfer position, the upper passage 87a is released. The transfer position of the upper hatch 85a is set in such a way as not to interfere with the external transfer arms 51a and 51b. Therefore, the external transfer arms 51a and 51b can move under the upper hatch 85a. When the upper hatch 85a is shifted to the close position, on the other hand, the upper hatch 85a contacts the top surface of the top wall 82a, thus closing the upper passage 87a.

The upper stage 86a has a disk shape whose outside diameter is large enough to be able to close the lower portion of the upper passage 87a. The upper stage 86a is movable vertically in the vacuum transfer chamber 82 by an unillustrated actuator. The position of the upper stage 86a can be switched between the transfer position shown in FIG. 13 and the close position shown in FIG. 14.

When the upper stage 86a is at the transfer position, the turning internal transfer arms 47a and 47b can pass above the upper stage 86a. That is, the transfer position of the upper stage 86a is so set as not to interfere with the rotating internal transfer arms 47a and 47b. When the upper stage 86a is at the close position, the upper stage 86a abuts the bottom surface of the top wall 82a, thus closing the upper passage 87a.

An upper wafer holder 88a is provided on the top surface of the upper stage 86a and is designed to not interfere with the external transfer arms 51a and 51b and the internal transfer arms 47a and 47b. The upper wafer holder 88a holds a wafer W at a predetermined height from the top surface of the upper stage 86a. Wafers W are transferred by the external transfer arms 51a and 51b and the internal transfer arms 47a and 47b. Specifically, when the upper stage 86a is at the transfer position shown in FIG. 13, wafers W are transferred by the internal transfer arms 47a and 47b, and when the upper stage 86a is at the close position shown in FIG. 14, the wafers W are transferred by the external transfer arms 51a and 51b.

The height of the upper wafer holder 88a is so set that the external transfer arms 51a and 51b (see FIG. 5) can receive a wafer W held by the upper wafer holder 88a when the upper stage 86a is at the close position. The upper stage 86a can move down to the transfer position where the internal transfer arms 47a and 47b can receive a wafer W held by the upper wafer holder 88a.

The upper hatch 85a is provided with an exhaust valve 89a and a purge valve 90a. The upper passage 87a is closed by the upper hatch 85a and the upper stage 86a which are positioned at the close position. When the exhaust valve 89a is opened in the closed state, the inside of the L/L chamber 84a is pumped to a vacuum state by an unillustrated vacuum pump.

When the upper stage 86a is moved down to the transfer position after the inside of the L/L chamber 84a has reached a vacuum state, the wafer W held by the upper wafer holder 88a is transferred into the vacuum transfer chamber 82. The wafer W is picked up by the internal transfer arm 47a (47b) from the upper wafer holder 88a in the vacuum transfer chamber 82 and carried into the process chamber 43 in FIG. 5. The wafer W on the arm 47b (47a) is placed on the upper wafer holder 88a. As the upper stage 86a moves upward, the wafer W is transferred into the upper L/L chamber 84a. Since the upper passage 87a is closed by the upper hatch 85a at this time, the inside of the vacuum transfer chamber 82 is kept in a vacuum state.

When the purge valve 90a is opened with the upper passage 87a closed by the upper hatch 85a and the upper stage 86a, a nitrogen gas is supplied from an unillustrated gas source. The supplied nitrogen gas increases the pressures in the upper hatch 85a and the upper passage 87a nearly to the atmospheric pressure. Then, the upper hatch 85a is shifted to the transfer position. Consequently, the external transfer arm 51a (51b) holds the wafer W held by the upper wafer holder 88a. The wafer W held by the external transfer arm 51b (51a), on the other hand, is placed on the upper wafer holder 88a of the upper stage 86a at the transfer position. Since the upper passage 87a is closed by the upper stage 86a at this time, the insides of the vacuum transfer chamber 82 and the process chamber 43 are kept in a vacuum state.

As the upper passage 87a is closed by the upper stage 86a in the semiconductor manufacturing apparatus 81, the wafer W can be transferred under the atmospheric state while keeping the inside of the vacuum transfer chamber 82 in a vacuum state. Because the upper passage 87a is closed by the upper hatch 85a, the wafer W can be transferred into the vacuum transfer chamber 82 under a vacuum condition while keeping the inside of the vacuum transfer chamber 82 in a vacuum state. As apparent from the above, the upper passage 87a, the upper hatch 85a and the upper stage 86a constitute the upper L/L chamber 84a as a pre-pressurizing chamber, which can allow wafers W to be transferred between the carriers 49 and the vacuum transfer chamber 82 without opening the process chamber 43 to the atmosphere.

The lower L/L chamber 84b is provided under the upper L/L chamber 84a. The lower L/L chamber 84b is formed symmetrical to the upper L/L chamber 84a with the vacuum transfer chamber 82 in between. The lower L/L chamber 84b includes a lower L/L hatch 85b and a lower L/L stage 86b. The lower hatch 85b and the lower stage 86b are arranged with the bottom wall 82b of the vacuum transfer chamber 82 in between.

Formed in the bottom wall 82b is a lower passage 87b which connects the inside and outside of the vacuum transfer achamber 82 to each other. The lower passage 87b has a circular shape whose center lies at a predetermined point on the locus that is drawn by the centers of wafers W transferred by the internal transfer arms 47a and 47b. The inside diameter of the lower passage 87b is approximately the same as that of the upper passage 87a.

The shape of the lower hatch 85b is approximately the same as that of the upper hatch 85a. The lower hatch 85b is located symmetrical to the upper hatch 85a with the vacuum transfer chamber 82 in between. The lower hatch 85b is moved under the vacuum transfer chamber 82 by an unillustrated actuator. The lower hatch 85b is shiftable between the transfer position and the close position (neither shown).

When the lower hatch 85b is shifted to the transfer position, the external transfer arms 51a and 51b can move above the lower hatch 85b. That is, the transfer position of the lower hatch 85b is set so as not to interfere with the external transfer arms 51a and 51b. When the lower hatch 85b reaches the close position, the lower hatch 85b abuts the bottom surface of the bottom wall 82b, thus closing the lower passage 87b.

The lower stage 86b has a disk shape whose outside diameter is large enough to close the lower portion of the lower passage 87b. The lower stage 86b is movable vertically in the vacuum transfer chamber 82 by an unillustrated actuator. The position of the lower stage 86b can be switched between the transfer position (upper position) and the close position (lower position) (neither shown).

When the lower stage 86b is at the transfer position, the turning internal transfer arms 47a and 47b can pass above the lower stage 86b. That is, the transfer position of the lower stage 86b is set so as not to interfere with the rotating internal transfer arms 47a and 47b. When the lower stage 86b is at the close position, the lower stage 86b abuts the top surface of the bottom wall 82b, thus closing the lower passage 87b.

A lower wafer holder 88b is provided on the bottom surface of the lower stage 86b. The lower wafer holder 88b holds a wafer W at a predetermined height from the bottom surface of the lower stage 86b. Wafers W are transferred by the external transfer arms 51a and 51b and the internal transfer arms 47a and 47b. The lower wafer holder 88b is formed into such a shape so as not to interfere with the movements of the external transfer arms 51a and 51b and the internal transfer arms 47a and 47b. When the lower stage 86b is at the transfer position, wafers W are transferred by the internal transfer arms 47a and 47b, and when the lower stage 86b is at the close position, the wafers W are transferred by the external transfer arms 51a and 51b.

When the lower stage 86b is at the close position, as shown in FIG. 13, the external transfer arms 51a and 51b (see FIG. 5) can receive the wafer W that is held by the lower wafer holder 88b. When the lower stage 86b is at the transfer position, the internal transfer arms 47a and 47b can receive the wafer W that is held by the lower wafer holder 88b.

The lower hatch 85b is provided with an exhaust valve 89b and a purge valve 90b. The lower passage 87b is closed by the lower hatch 85b and the lower stage 86b which are positioned at the close position. When the exhaust valve 89b is opened with the lower passage 87b closed, the insides of the lower passage 87b and the lower hatch 85b are pumped to a vacuum state by the unillustrated vacuum pump.

When the lower stage 86b is moved to the transfer position, the wafer W held by the lower wafer holder 88b is transferred into the vacuum transfer chamber 82 in a vacuum state. The internal transfer arm 47a (47b) receives the wafer W from the lower wafer holder 88b and transfers it to the process chamber 43. The wafer W on the internal transfer arm 47b (47a) is placed on the lower wafer holder 88b. As the lower stage 86b moves downward, the wafer W is transferred into the lower passage 87b. Since the passage 87b is closed by the lower hatch 85b at this time, the inside of the vacuum transfer chamber 82 is kept in a vacuum state.

When the purge valve 90b is opened with the lower passage 87b closed by the lower hatch 85b and the lower stage 86b, a nitrogen gas is supplied to the lower L/L chamber 84b from the unillustrated gas source. This nitrogen gas increases the pressure in the lower L/L chamber 84b nearly to the atmospheric pressure. When the lower hatch 85b is shifted to the transfer position, the external transfer arm 51a (51b) holds the wafer W held by the lower wafer holder 88b of the lower stage 86b. The wafer W held by the external transfer arm 51b (51a) is placed on the lower wafer holder 88b of the lower stage 86b at the transfer position. Because the lower passage 87b is closed by the lower stage 86b at this time, the inside of the vacuum transfer chamber 82 and the process chamber 43 are kept in a vacuum state.

In other words, the lower passage 87b is closed by the lower stage 86b in the semiconductor manufacturing apparatus 81, so that the wafer W can be transferred under atmospheric pressure while maintaining the inside of the vacuum transfer chamber 82 in a vacuum state. Because the lower passage 87b is closed by the lower hatch 85b and becomes a vacuum, the wafer W can be transferred under a vacuum state. As apparent from the above, the lower passage 87b, the lower hatch 85b and the lower stage 86b constitute the lower L/L chamber 84b as a pre-pressurizing chamber, which allows wafers W to be transferred between the carriers 49 and the vacuum transfer chamber 82 without opening the process chamber 43 to the atmosphere.

The transfer operation of the semiconductor manufacturing apparatus 81 will now be described according to a transfer sequence shown in FIG. 15. As the transfer operation between the vacuum transfer chamber 82 and the process chamber 43 is the same as that in the first embodiment, its description will be omitted below.

The following description will be given on the assumption that the semiconductor manufacturing apparatus 81 is in the following state at the beginning of the operation shown in FIG. 15. The upper and lower L/L chambers 84a and 84b retain unprocessed wafers W. The upper internal transfer arm 47a of the internal transfer robot 45 is holding a processed wafer W. A process on a wafer W is performed in the process chamber 43. The first external transfer arm 51a of the external transfer robot 46 is holding an unprocessed wafer W which has been taken out of the carrier 49.

Figure 15:
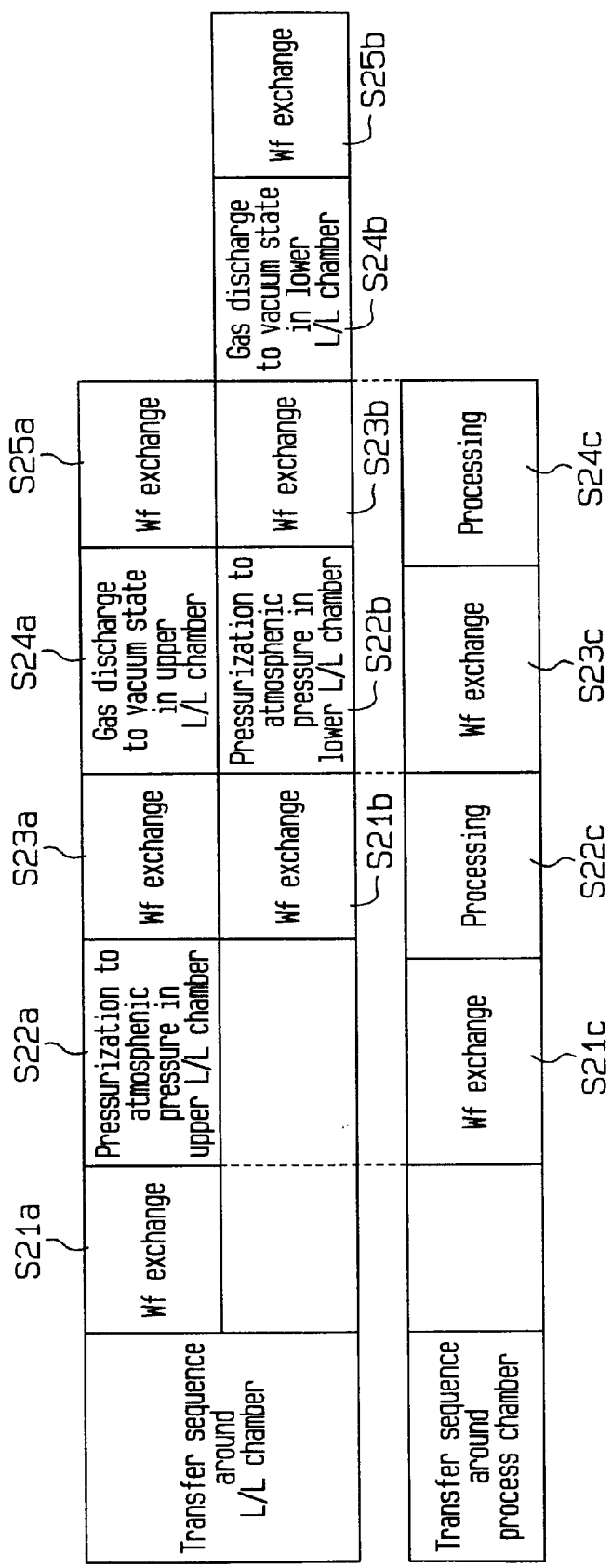
FIG. 15 is a diagram showing a transfer sequence of the apparatus of FIG. 12.

The computer 71 performs wafer transfer via the upper L/L chamber 84a according to steps S21a to S25a in FIG. 15, wafer transfer via the lower L/L chamber 84b according to steps S21b to S25b and wafer transfer via the process chamber 43 according to steps S21c and S24c.

First, in step S21a, the computer 71 carries out a "Wf exchange step" in the upper L/L chamber 84a. In the Wf exchange step, the lower internal transfer arm 47b receives the unprocessed wafer W retained in the upper L/L chamber 84a. The processed wafer W held by the upper internal transfer arm 47a is placed on the wafer holder 64 in the upper L/L chamber 84a.

Next, the computer 71 opens the purge valve 90a to feed the nitrogen gas into the upper L/L chamber 84a to raise the pressure in the upper L/L chamber 84a (step S22a). By this time, the process on the wafer W in the process chamber 43 has already been completed. At the same time, the computer 71 performs a "Wf exchange step" in the process chamber 43 (step S21c). In this step, the upper internal transfer arm 47a receives the processed wafer W from the process chamber 43 according to the sequence in FIGS. 10A to 10D. The unprocessed wafer W held by the lower internal transfer arm 47b is placed in the process chamber 43. Then, the computer 71 performs a predetermined process on the wafer W retained in the process chamber 43 (step S22c).

When step S22a is completed, the computer 71 performs a "Wf exchange step" in the upper L/L chamber 84a under atmospheric pressure (step S23a). In this step, the unprocessed wafer W held by the first external transfer arm 51a is exchanged with the processed wafer W in the upper L/L chamber 84a. By this time, the "Wf exchange step" in the process chamber 43 has already been completed. Accordingly, the computer 71 performs a "Wf exchange step" in the lower L/L chamber 84b (step S21b) at the same time as the "Wf exchange step" in the upper L/L chamber 84a. Through step S21b, the processed wafer W held by the upper internal transfer arm 47a is exchanged with the unprocessed wafer W retained in the lower L/L chamber 84b.

When step S23a is finished, the computer 71 manipulates the exhaust valve 89a to set the upper L/L chamber 84a in a vacuum state in step S24a. At the same time, the computer 71 manipulates the purge valve 90b to feed a nitrogen gas into the lower L/L chamber 84b in step S22b. By this time, the process in step S22c has already been completed. Accordingly, the computer 71 performs a "Wf exchange step" in the process chamber 43 (step S22c) at the same time as steps S24a and S22b. In step S22c, the unprocessed wafer W held by the lower internal transfer arm 47b is exchanged with the processed wafer W in the process chamber 43.

When the inside of the upper L/L chamber 84a reaches a vacuum, the computer 71 executes a "Wf exchange step" in the upper L/L chamber 84a in the same way as done in step S21a (step S25a). The computer 71 executes a "Wf exchange step" in the lower L/L chamber 84b (step S23b) in the same way as done for the "Wf exchange step" in the upper L/L chamber 84a (step S23a).

Next, the computer 71 sets the lower L/L chamber 84b in a vacuum state (step S24b) in the same way as done in step S24a. Further, the computer 71 executes a "Wf exchange step" in the lower L/L chamber 84b (step S25b) in the same way as done in the step S25a.

That is, the computer 71 alternately performs "depressurization" and "gas supply" with respect to the upper and lower L/L chambers 84a and 84b to shorten the transfer procedures. This quickens the wafer transfer sequence in a semiconductor manufacturing apparatus which involves a short time for wafer processing in the process chamber 43.

The second embodiment has the following advantage in addition to the advantages of the first embodiment.

(1) The semiconductor manufacturing apparatus 81 has two L/L chambers 84a and 84b arranged hierarchically. The footprint of the L/L chambers 84a and 84b is smaller than that of the conventional semiconductor manufacturing apparatus 11 or 31. Further, wafers W are fed vertically to the internal transfer arms 47a and 47b from the L/L chambers 84a and 84b. This reduces the size of the site area of the vacuum transfer chamber 82 including the L/L chambers 84a and 84b with respect to the entire site area of the semiconductor manufacturing apparatus 81.

Third Embodiment

A semiconductor manufacturing apparatus 91 according to a third embodiment will be described below with reference to FIGS. 16 to 20, focusing on the differences from the first and second embodiments.

Figure 16:
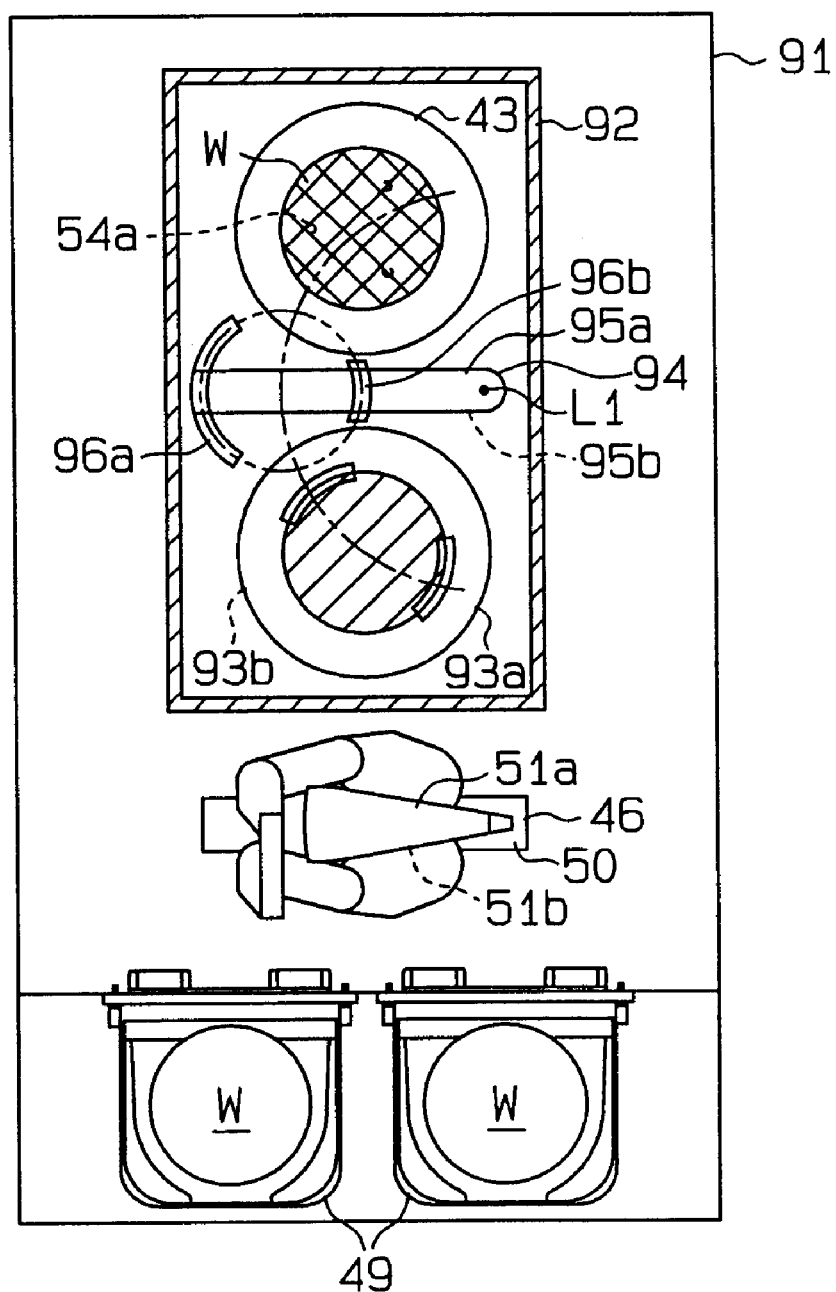
FIG. 16 is a plan view showing a semiconductor manufacturing apparatus according to a third embodiment of this invention.

As shown in FIG. 16, the semiconductor manufacturing apparatus 91 has a vacuum transfer chamber 92, a process chamber 43 and two load-lock (L/L) chambers 93a and 93b. The semiconductor manufacturing apparatus 91 further has an internal transfer robot 94 and an external transfer robot 46.

The vacuum transfer chamber 92 is a rectangular parallelepiped. The first and second L/L chambers 93a and 93b are arranged perpendicularly as per the second embodiment. This embodiment therefore carries out the transfer sequences between the carriers 49 and the first and second L/L chambers 93a and 93b as per the second embodiment.

The internal transfer robot 94 is located in the vacuum transfer chamber 92. The internal transfer robot 94 has two internal transfer arms 95a and 95b arranged hierarchically. Those internal transfer arms 95a and 95b are rotatable on a horizontal plane about an axis L1 in the vacuum transfer chamber 92 and are vertically movable along the axis L1 (see FIG. 6).

The process chamber 43 and the upper L/L chambers 93a and 93b are located on the rotational locus of the internal transfer arms 95a and 95b. As the L/L chambers 93a and 93b are arranged vertically, the footprint of the L/L chambers 93a and 93b is smaller than that of the L/L chambers 14 and 15 of the conventional semiconductor manufacturing apparatus 11 or 31 shown in FIG. 1 or 3.

The internal transfer robot 94 transfers wafers W between the process chamber 43 and the L/L chambers 93a and 93b only by the rotational and vertical movements of the internal transfer arms 95a and 95b, as per the first embodiment. Unlike the conventional internal transfer robots 20 and 32 (see FIGS. 1 and 3), therefore, the whole internal transfer robot 45 need not be rotated. As the internal transfer arms 95a and 95b do not have a plurality of joints, they are easily controlled.

The process chamber 43 and the centers of the first and second L/L chambers 93a and 93b lie on the locus that is drawn by the centers of wafers W transferred by the internal transfer arms 95a and 95b. In the semiconductor manufacturing apparatus 91, there is no buffer area in the vacuum transfer chamber 92 and wafers W are transferred directly between the L/L chambers 93a and 93b and the process chamber 43. Therefore, the distances between the process chamber 43 and the L/L chambers 93a and 93b are shorter than those in the first and second embodiments. This makes the vacuum transfer chamber 92 smaller than those of the first and second embodiments.

The internal transfer arms 95a and 95b each have first and second arcuate holding pieces 96a and 96b for holding wafers W. The first holding piece 96a is located at the distal end of each of the internal transfer arms 95a and 95b. The second holding piece 96b is positioned apart from the first holding piece 96a along the axis L1 by a distance corresponding to the outside diameter of the wafers W. As the length of the second holding piece 96b is about the same as the width of the arm 95a or 95b, the second holding piece 96b does not interfere with the first and second L/L chambers 93a and 93b. The length of the first holding piece 96a is determined in such a way that the first holding piece 96a stabilizes the wafer W to be transferred in cooperation with the second holding piece 96b.

The process chamber 43 and the first and second L/L chambers 93a and 93b will be discussed below.

The process chamber 43 includes a process-chamber hatch 52 integrated with the top wall 92a of the vacuum transfer chamber 92 and a process-chamber stage 53. The process-chamber stage 53 is moved vertically by an unillustrated actuator. The process-chamber stage 53 is provided with three lift pins 54a which are elevated up and down by an unillustrated actuator. Each lift pin 54a is a dual-position lift pin. That is, there are three stop positions for the lift pin 54a: a first stop position for receiving a wafer Wa held by the first internal transfer arm 95a, a second stop position for receiving a wafer Wb held by the second internal transfer arm 95b and a load position for loading the received wafer W on the process-chamber stage 53.

The first L/L chamber 93a includes an upper L/L hatch 97a and an upper L/L stage 97b. The upper hatch 97a is moved upward by an unillustrated actuator. The upper stage 98a is moved vertically by an unillustrated actuator. The upper hatch 97a and the upper stage 98a are arranged with the top wall 92a of the vacuum transfer chamber 92 in between.

Formed in the top wall 92a is an upper passage 99a which connects the inside and outside of the vacuum transfer chamber 92 to each other. The upper passage 99a has an inside diameter large enough to allow a wafer W in a horizontal position to pass vertically. The upper hatch 97a closes the upper passage 99a at the close position, and the upper stage 98a closes the upper passage 99a at the close position.

When the upper hatch 97a is at the transfer position, it does not interfere with the external transfer arms 51a and 51b. When the upper stage 98a is at the transfer position, it does not interfere with the rotating internal transfer arms 95a and 95b.

An upper wafer holder 100a is provided on the top surface of the upper stage 98a. The upper wafer holder 100a holds two wafers W respectively at predetermined distances from the top surface of the upper stage 98a. When the upper stage 98a is at the close position, the two wafers W held by the upper wafer holder 100a are positioned above the top wall 92a of the vacuum transfer chamber 92 as shown in FIG. 18.

Figure 17:
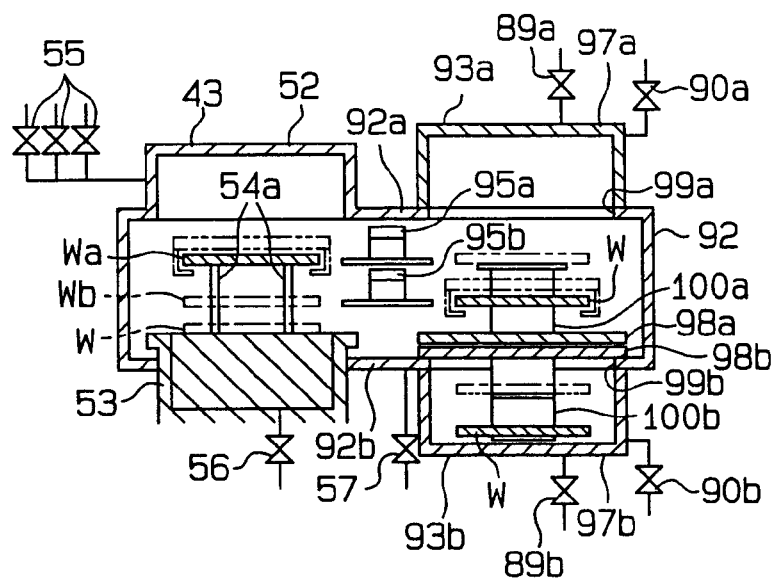
FIG. 17 is a side cross-sectional view depicting a load-lock chamber and a process chamber of the apparatus in FIG. 16.
Figure 18:
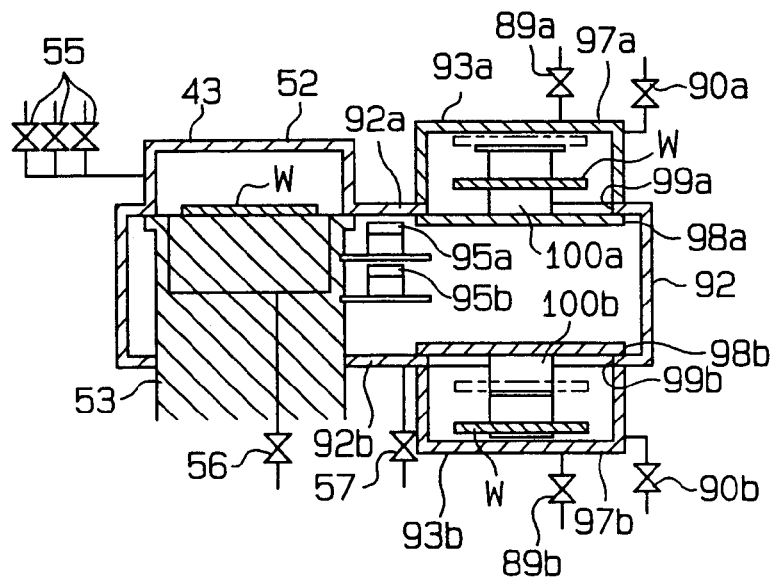
FIG. 18 is a side cross-sectional view depicting the load-lock chamber and the process chamber of the apparatus in FIG. 16.

When the upper stage 98a is at the transfer position shown in FIG. 17, wafers W are transferred by the internal transfer arms 95a and 95b, and when the upper stage 98a is at the close position shown in FIG. 18, the wafers W are transferred by the external transfer arms 51a and 51b. The upper wafer holder 100a is designed so as not to interfere with the external transfer arms 51a and 51b and the internal transfer arms 95a and 95b.

The second L/L chamber 93b includes a lower L/L hatch 97b and a lower L/L stage 98b. The lower hatch 97b is moved downward by the unillustrated actuator. The lower stage 98b is moved vertically by the unillustrated actuator. The lower hatch 97b and the lower stage 98b are arranged with the bottom wall 92b of the vacuum transfer chamber 92 in between.

Formed in the bottom wall 92b is a lower passage 99b which connects the inside and outside of the vacuum transfer chamber 92 to each other. The lower passage 99b has an inside diameter large enough to pass a wafer W in a horizontal position. The lower hatch 97b closes the lower passage 99b at the close position, and the lower stage 98b closes the lower passage 99b at the close position.

The lower hatch 97b is symmetrical to the upper hatch 97a. When the lower hatch 97b is at the transfer position, it does not interfere with the external transfer arms 51a and 51b. When the lower stage 98b is at the transfer position, it does not interfere with the rotating internal transfer arms 95a and 95b.

A lower wafer holder 100b is provided on the bottom surface of the lower stage 98b. Two wafers W held by the lower wafer holder 100b are positioned below the bottom surface of the lower stage 98b as shown in FIGS. 17 and 18.

The lower wafer holder 100b has such a shape so as not to interfere with the movements of the external transfer arms 51a and 51b and the internal transfer arms 95a and 95b. When the lower stage 98b is at the transfer position, wafers W are transferred by the internal transfer arms 95a and 95b, and when the lower stage 98b is at the close position, the wafers W are transferred by the external transfer arms 51a and 51b.

The lift pins 54a can receive wafers W from the internal transfer arms 95a and 95b without moving the process-chamber stage 53. The internal transfer arms 95a and 95b can transfer wafers W on the upper and lower wafer holders 100a and 10b. As apparent from the above, wafers W are directly and easily transferred between the process chamber 43 and the first and second L/L chambers 93a and 93b by the internal transfer arms 95a and 95b.

The transfer operation of the internal transfer robot 94 in the semiconductor manufacturing apparatus 91 will now be discussed.

FIGS. 19A to 19D illustrate the movements of the internal transfer arms 95a and 95b in a case of exchanging a processed wafer W in the process chamber 43 with an unprocessed wafer W in the first L/L chamber 93a (or the second L/L chamber 93b).

Figure 19A:
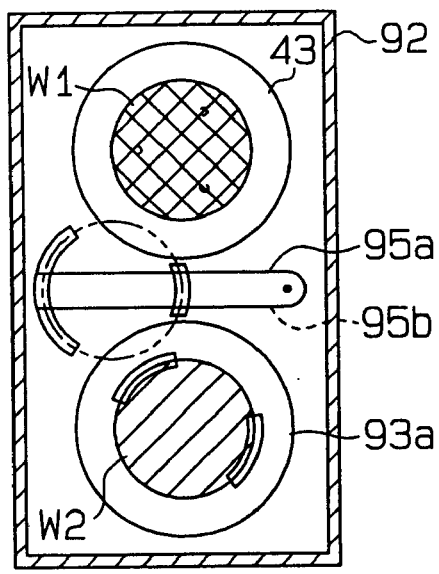
FIGS. 19A to 19D are plan views illustrating the movements of the internal transfer arms of the apparatus in FIG. 16.

In the state in FIG. 19A, wafer processing in the process chamber 43 has already been completed. A processed wafer W1 is held by the lift pin 54a in the process chamber 43, and an unprocessed wafer W2 is held by the wafer holder 100a in the first L/L chamber 93a.

The computer 71 controls the exchange of a processed wafer W1 with an unprocessed wafer W2 according to the following steps (31) to (33).

Figure 19B:
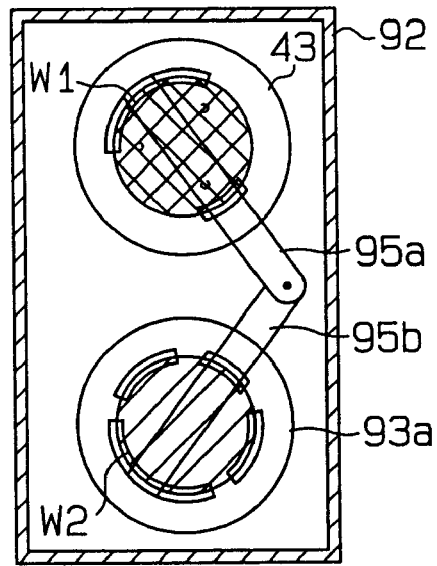

(31) The computer 71 moves the process-chamber stage 53 down to the transfer position in FIG. 17. The computer 71 then rotates the first internal transfer arm 95a of the internal transfer robot 94 to an exchange position where the wafer W1 in the process chamber 43 is to be held and rotates the second internal transfer arm 95b to an exchange position where the wafer W2 in the first L/L chamber 93a is to be held (FIGS. 19A and 19B).

Figure 19C:
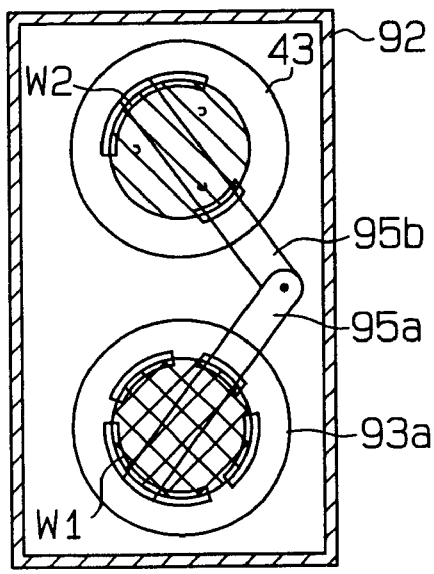

(32) The computer 71 lifts the first and second internal transfer arms 95a and 95b to hold the processed wafer W1 and the unprocessed wafer W2. Next, the computer 71 simultaneously perform the rotation of the first internal transfer arm 95a to the first L/L chamber 93a from the process chamber 43 and the rotation of the second internal transfer arm 95b to the process chamber 43 from the first L/L chamber 93a (FIG. 19C).

Figure 19D:
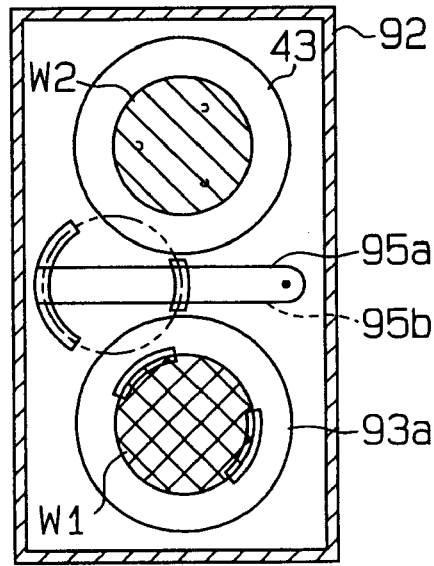

(33) The computer 71 moves the first and second internal transfer-arms 95a and 95b down and places the unprocessed wafer W2 on the lift pin 54a in the process chamber 43 and the processed wafer W1 on the upper wafer holder 10a in the first L/L chamber 93a. Thereafter, the computer 71 rotates the first and second internal transfer arms 95a and 95b to a standby position where the arms do not interfere with the process chamber 43 and the first and second L/L chambers 93a and 93b (FIG. 19D).

Through the above steps, the computer 71 directly exchanges the processed wafer W1 in the process chamber 43 with the unprocessed wafer W2 in the first L/L chamber 93a. Thereafter, the computer 71 lifts the process-chamber stage 53, thus forming the process chamber 43. Then, the computer 71 performs a wafer process on the unprocessed wafer W2 according to the recipes.

As the operation for directly exchanging the processed wafer W in the process chamber 43 with the unprocessed wafer W in the second L/L chamber 93b is the same as the above-described exchange operation involving the first L/L chamber 93a, its description will not be given below.

The transfer operation of the semiconductor manufacturing apparatus 91 will now be described according to the transfer sequence shown in FIG. 20.

It is assumed that unprocessed wafers W are held in the first and second L/L chambers 93a and 93b. It is also assumed that a process on a wafer W in the process chamber 43 is under way. It is further assumed that the first external transfer arm 51a of the external transfer robot 46 is holding an unprocessed wafer W which has been unloaded from the carrier 49.

Figure 20:
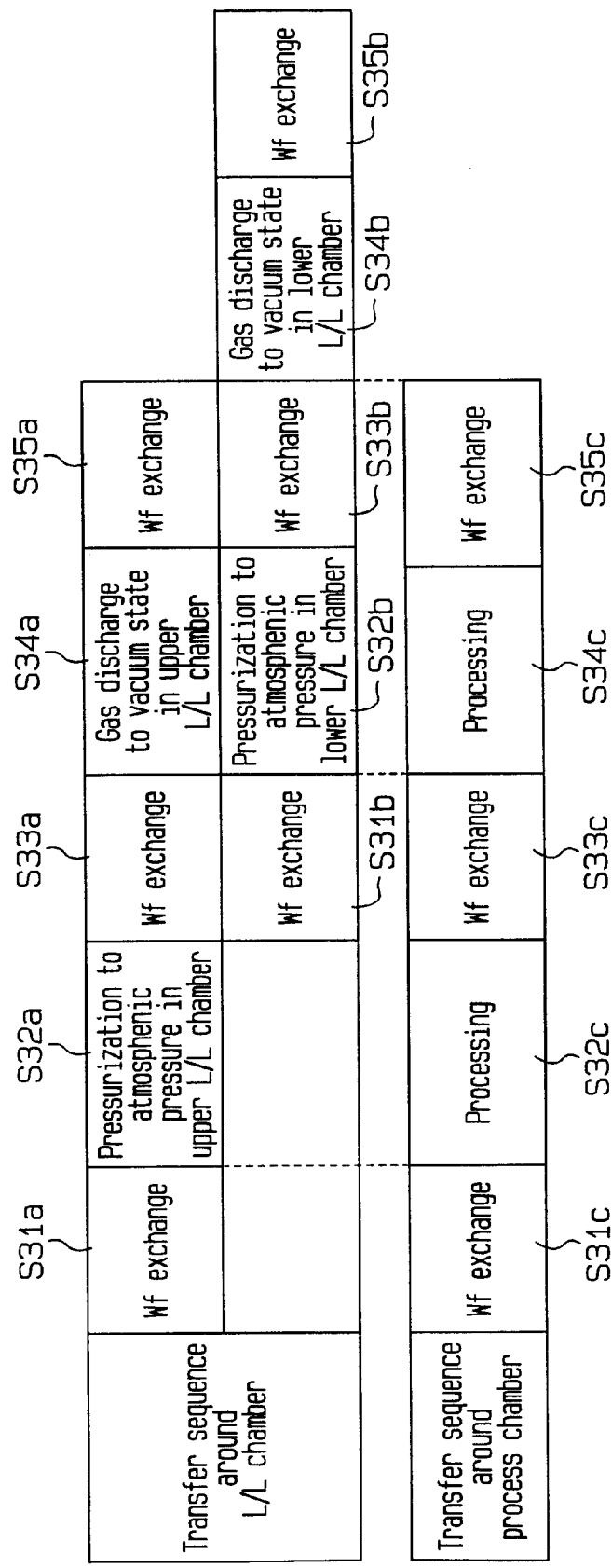
FIG. 20 is a diagram showing a transfer sequence of the apparatus of FIG. 16.

The computer 71 performs wafer transfer via the first L/L chamber 93a according to steps S31a to S35a in FIG. 20, wafer transfer via the second L/L chamber 93b according to steps S31b to S35b and wafer transfer via the process chamber 43 according to steps S31c and S35c.

First, the computer 71 carries out a "Wf exchange step" in the first L/L chamber 93a (step S31a). The "Wf exchange step" in step S31a is directly carried out between the process chamber 43 and the first L/L chamber 93a. Therefore, the computer 71 executes the process for the process chamber 43 in step S31c in parallel to the process in step S31a. Through steps S31a and 31c, the processed wafer W in the process chamber 43 is exchanged with the unprocessed wafer W in the first L/L chamber 93a.

Next, the computer 71 opens the purge valve 90a to set the pressure in the first L/L chamber 93a to atmospheric pressure (step S32a). During this process, the wafer W in the process chamber 43 is being processed (step S32c).

When step S32a is finished, the computer 71 exchanges the processed wafer W in the first L/L chamber 93a with the unprocessed wafer W held by the external transfer arm 51a (step S33a). By the time step S32a is completed, the process in the process chamber 43 has been finished (step S32c). Then, the computer 71 carries out a "Wf exchange step" in the process chamber 43 and the second L/L chamber 93b (steps S31b and S33c).

When those exchanges are completed, the computer 71 manipulates the exhaust valve 89a to set the first L/L chamber 93a in a vacuum state (step S34a). At the same time, the computer 71 manipulates the purge valve 90b to set the pressure in the second L/L chamber 93b to the atmospheric pressure (step S32b). Further, the computer 71 executes a wafer process in the process chamber 43.

When the inside of the first L/L chamber 93a comes to the vacuum state, the computer 71 executes a "Wf exchange step" in the process chamber 43 and the first L/L chamber 93a (steps S35c and S35a) in the same way as done in step S31a. The computer 71 also performs a "Wf exchange step" in the second L/L chamber 93b (step S33b) in the same way as the "Wf exchange step" in the first L/L chamber 93a in step S33a.

Then, the computer 71 executes "vacuuming" to the second L/L chamber 93b (step S34b) in the same way as "vacuuming" to the first L/L chamber 93a. Further, the computer 71 performs the "Wf exchange step" in the second L/L chamber 93b (step S35b) in the same way as the "Wf exchange step" in the first L/L chamber 93a in step S35a.

Through the transfer sequence in FIG. 20, the computer 71 alternately performs "depressurization" and "pressurization" with respect to the first and second L/L chambers 93a and 93b, thereby quickening the wafer transfer procedures between the atmospheric area and the vacuum area.

The third embodiment has the following advantage in addition to the advantages of the first and second embodiments.

(1) In the semiconductor manufacturing apparatus 91, the internal transfer robot 94 directly transfers wafers W between the L/L chambers 93a and 93b and the process chamber 43 by means of the internal transfer arms 95a and 95b. This eliminates the need for a buffer area in the vacuum transfer chamber 92 for temporarily holding wafers W. It is thus possible to shorten the distances between the process chamber 43 and the L/L chambers 93a and 93b. This can make the vacuum transfer chamber 92 smaller.

Fourth Embodiment

A semiconductor manufacturing apparatus 101 according to a fourth embodiment will be described below with reference to FIGS. 21 to 24.

Figure 21:
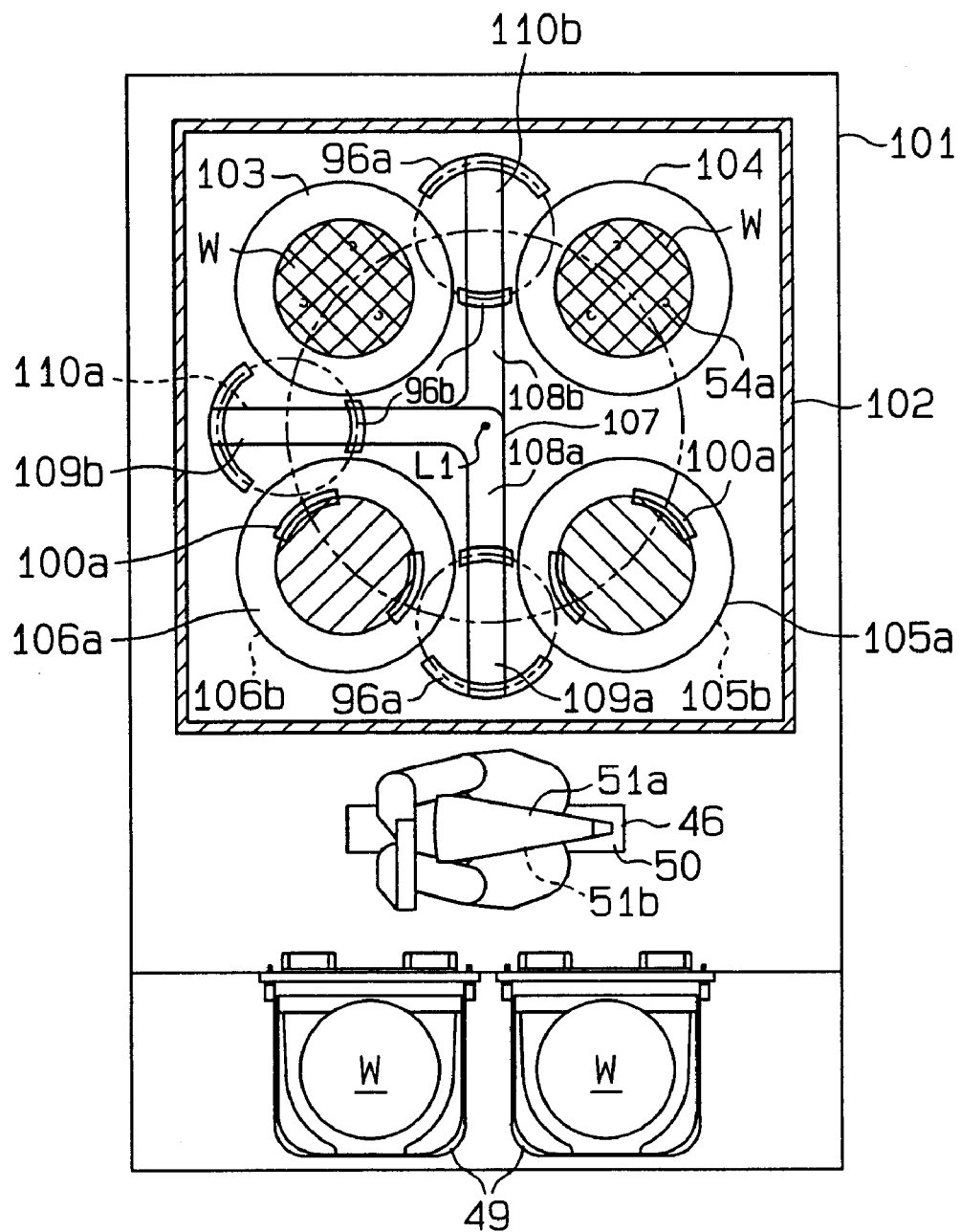
FIG. 21 is a plan view showing a semiconductor manufacturing apparatus according to a fourth embodiment of this invention.

As shown in FIG. 21, the semiconductor manufacturing apparatus 101 has a vacuum transfer chamber 102, two process chambers 103 and 104 and four load-lock (L/L) chambers 105a, 105b, 106a and 106b. Those individual chambers allow the semiconductor manufacturing apparatus 101 to simultaneously perform processes on two wafers W. The semiconductor manufacturing apparatus 101 further has an internal transfer robot 107 and an external transfer robot 46.

The vacuum transfer chamber 102 has a square shape in a horizontal cross-section. The internal transfer robot 107 is located in the vacuum transfer chamber 102. The internal transfer robot 107 has first and second internal transfer arms 108a and 108b bent at right angles. The first and second internal transfer arms 108a and 108b are arranged apart vertically from each other. The first and second internal transfer arms 108a and 108b are rotatable on a horizontal plane about an axis L1 positioned in the center of the vacuum transfer chamber 102 and are movable along the axis L1 (see FIG. 6).

The first internal transfer arm 108a has first and second hand sections 109a and 109b for holding a plurality of wafers W (two in this embodiment). The first hand section 109a, like the internal transfer arm 95a of the third embodiment, is provided with first and second holding pieces 96a and 96b. Likewise, the second hand section 109b is provided with first and second holding pieces 96a and 96b.

Likewise, the second internal transfer arm 108b has first and second hand sections 110a and 100b for holding a plurality of wafers W. Each of those hand sections 110a and 110b is provided with first and second holding pieces 96a and 96b.

The process chambers 103 and 104 and the upper L/L chambers 105a and 106a are arranged at intervals of 90 degrees on the rotational locus of the internal transfer arms 108a and 108b indicated by a dotted line.

The process chamber 103 is similar to the process chamber 43 in the third embodiment. The process chamber 104 is symmetrical with the process chamber 103 with respect to an imaginary plane perpendicular to FIG. 21 and including the axis L1. The same process is performed on wafers W in both chambers 103 and 104.

Figure 22:
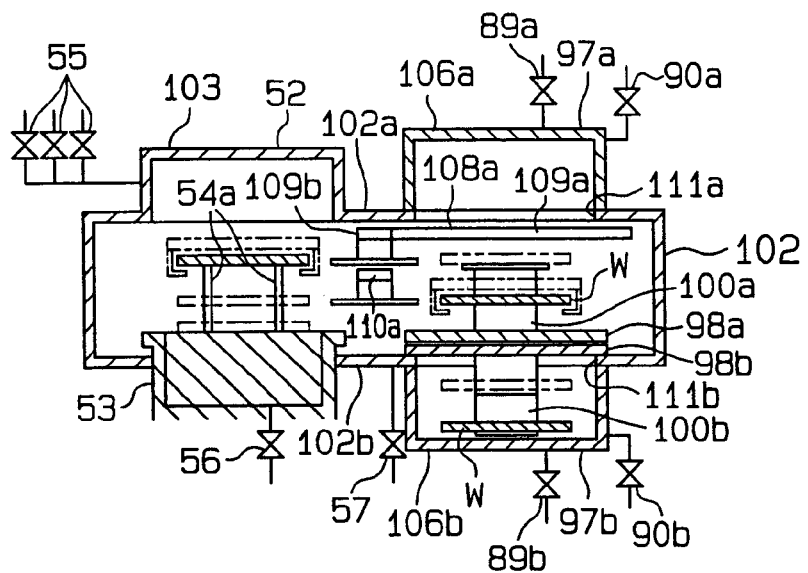
FIG. 22 is a side cross-sectional view depicting a load-lock chamber and a process chamber of the apparatus in FIG. 21.
Figure 23:
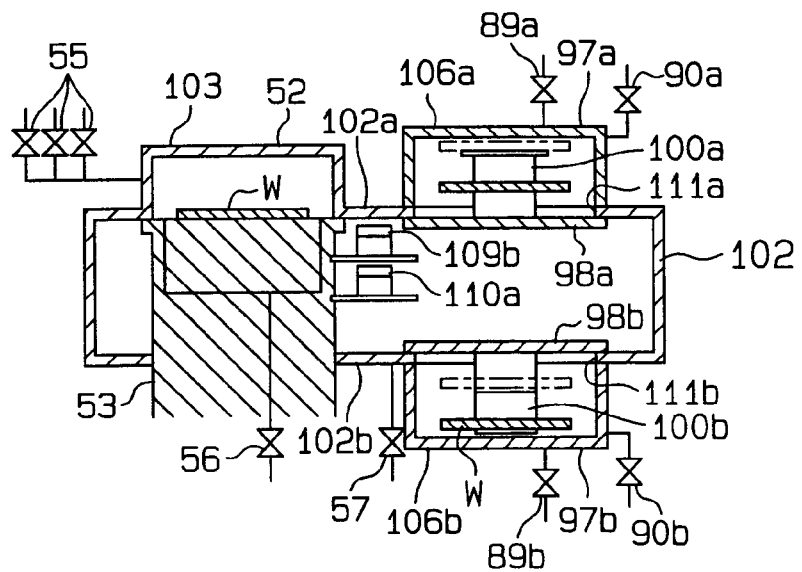
FIG. 23 is another side cross-sectional view depicting the load-lock chamber and the process chamber of the apparatus in FIG. 21.

The L/L chambers 106a and 106b have the same structures as the first and second L/L chambers 93a and 93b in the third embodiment (FIGS. 17 and 18). As shown in FIGS. 22 and 23, the upper L/L chamber 105a is located directly above the lower L/L chamber 105b, and the upper L/L chamber 106a is located directly above the lower L/L chamber 106b. The L/L chambers 105a and 105b are respectively symmetrical to the L/L chambers 106a and 106b with respect to the imaginary plane perpendicular to FIG. 21 and including the axis L1.

FIG. 22 shows a wafer W being directly transferred between the process chamber 103 and the upper L/L chamber 106a. FIG. 23 shows the process chamber 103 and the L/L chambers 106a and 106b. As the process chamber 104 is symmetrical to the process chamber 103 and the L/L chambers 105a and 105b are respectively symmetrical to the L/L chambers 106a and 106b, those chambers 104, 105a and 105b are not illustrated.

Because the first hand sections 109a and 110a and the second hand sections 109b and 110b are arranged at angles of 90 degrees therebetween, each of the first and second internal transfer arms 108a and 108b of the fourth embodiment can simultaneously hold two wafers W located in adjoining two of the process chambers 103 and 104 and the L/L chambers 105a and 106a (105b and 106b) and transfer and unload the wafers W.

The first hand sections 109a and 110a and the second hand sections 109b and 100b may be arranged at angles of 180 degrees therebetween. In this case, each of the first and second internal transfer arms 108a and 108b can simultaneously transfer wafers W located in the process chamber 103 and the L/L chamber 105a (or 105b) and the process chamber 104 and the L/L chamber 106a (or 106b).

The internal transfer robot 107 simultaneously transfers two wafers W between the process chambers 103 and 104 and the L/L chambers 105a and 106a (or 105b and 106b) merely by the rotational and vertical movements of the internal transfer arms 108a and 108b, as per the second embodiment.

Unlike the conventional internal transfer robots 20 and 32 (see FIGS. 1 and 3), the whole internal transfer robot 107 of the fourth embodiment need not be rotated. As the internal transfer arms 108a and 108b do not have a plurality of joints, they are easily controlled.

In the semiconductor manufacturing apparatus 101 of the fourth embodiment, like that of the third embodiment, the centers of the process chamber 103 and 104 and the L/L chambers 105a and 105b lie on the rotational locus of the internal transfer arms 108a and 108b of the internal transfer robot 107 (specifically, on the locus of the centers of wafers W to be transferred by the arms 108a and 108b). Because wafers W are transferred directly between the L/L chambers 105a and 105b and the process chambers 103 and 104, no buffer area is needed in the vacuum transfer chamber 102. Therefore, the distances between the process chambers 103 and 104 and the L/L chambers 105a and 105b are shorter than those in the first and second embodiments, and the vacuum transfer chamber 102 is smaller than those of the first and second embodiments.

The transfer operation of the internal transfer robot 107 will now be discussed.

FIGS. 24A to 24D illustrate the movements of the internal transfer arms 108a and 108b in a case of directly exchanging processed wafers W in the process chambers 103 and 104 with unprocessed wafers W in the upper L/L chambers 105a and 106a.

It is assumed that wafer processes in the process chambers 103 and 104 have already been completed. That is, in FIG. 24A, processed wafers W1 are held by the lift pins 54a in the process chambers 103 and 104, and unprocessed wafers W2 are held by the wafer holders 100a in the L/L chambers 105a and 106a.

The computer 71 causes the apparatus 101 to exchange a processed wafer W1 with an unprocessed wafer W2 according to the following steps (41) to (43).

Figure 24A:
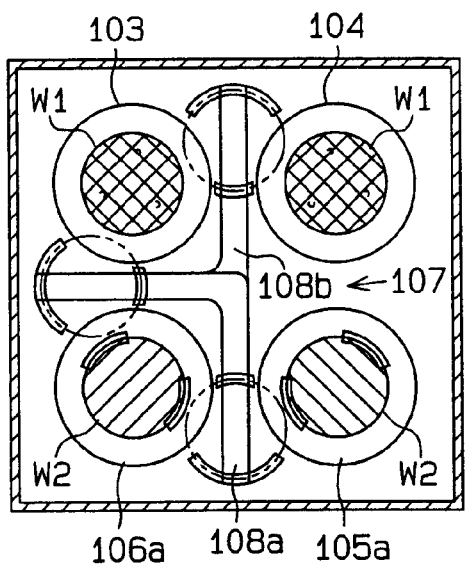
FIGS. 24A to 24D are plan views illustrating the movements of internal transfer arms of the apparatus in FIG. 21.
Figure 24B:
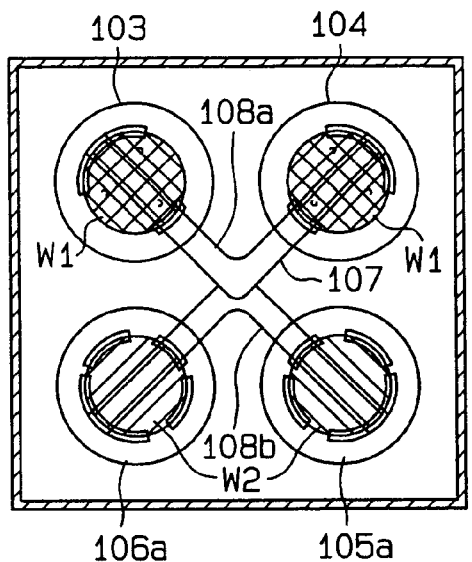

(41) The computer 71 moves the process-chamber stages 53 in the process chambers 103 and 104 down to the transfer position in FIG. 22. The computer 71 then rotates the first internal transfer arm 108a of the internal transfer robot 107 to an exchange position where the wafers W1 in the process chambers 103 and 104 are to be held and rotates the second internal transfer arm 108b to an exchange position where the wafers W2 in the upper L/L chambers 105a and 106a are to be held (FIGS. 24A and 24B).

Figure 24C:
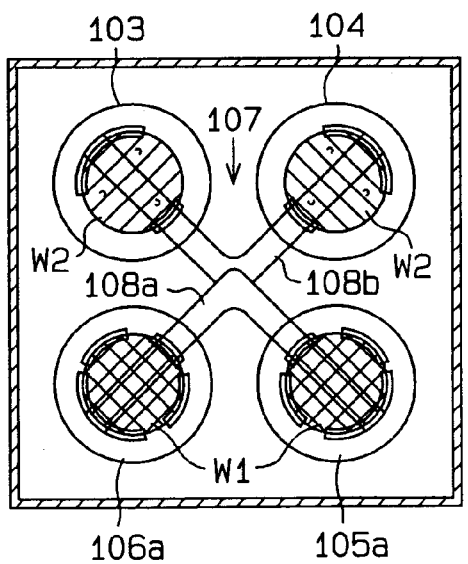

(42) The computer 71 lifts the first and second internal transfer arms 108a and 108b to hold the processed wafer W1 and the unprocessed wafer W2. Next, the computer 71 simultaneously performs the rotation of the first internal transfer arm 108a to the upper L/L chambers 105a and 106a from the process chambers 103 and 104 and the rotation of the second internal transfer arm 108b to the process chambers 103 and 104 from the upper L/L chambers 105a and 106a (FIG. 24C). This permits the wafers W1 in the process chambers 103 and 104 to be exchanged with the unprocessed wafers W2.

Figure 24D:
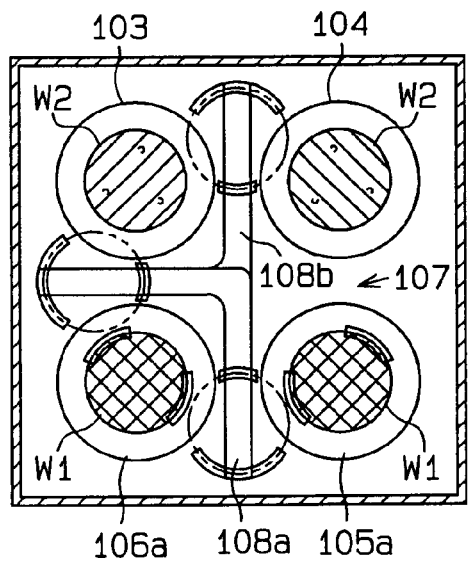

(43) The computer 71 moves the first and second internal transfer arms 108a and 108b down and places the unprocessed wafers W2 on the lift pins 54a in the process chambers 103 and 104 and the processed wafers W1 on the upper wafer holders 100a in the upper L/L chambers 105a and 106a. Thereafter, the computer 71 rotates the first and second internal transfer arms 108a and 108b to a standby position where the arms do not interfere with the process chambers 103 and 104 and the L/L chambers 105a and 105b (FIG. 24D).

Through the above steps, the computer 71 exchanges the processed wafers W1 in the process chambers 103 and 104 with the unprocessed wafers W2 in the upper L/L chambers 105a and 106a and then lifts the process-chamber stages 53. In the process chambers 103 and 104 tightly closed by the process-chamber stages 53, wafer processing is performed on the unprocessed wafers W2 according to the recipes. By simultaneously processing two wafers in this manner, the system throughput is increased.

The operation for exchanging the processed wafers W in the process chambers 103 and 104 with the unprocessed wafers W in the lower L/L chambers 105b and 106b is the same as the above-described exchange operation involving the upper L/L chambers 105a and 106a.

The fourth embodiment has the following advantage in addition to the advantages of the first to third embodiments.

(1) The semiconductor manufacturing apparatus 101 has two process chambers 103 and 104 and four L/L chambers 105a, 105b, 106a and 106b. The semiconductor manufacturing apparatus 101 further has the internal transfer robot 107 having the internal transfer arms 108a and 108b which can simultaneously hold two wafers W. This structure allows the semiconductor manufacturing apparatus 101 to simultaneously transfer two wafers W and perform processes, so that high throughput can be maintained.

Fifth Embodiment

A semiconductor manufacturing apparatus 121 according to a fifth embodiment will be described below with reference to FIGS. 25 to 28.

Figure 25:
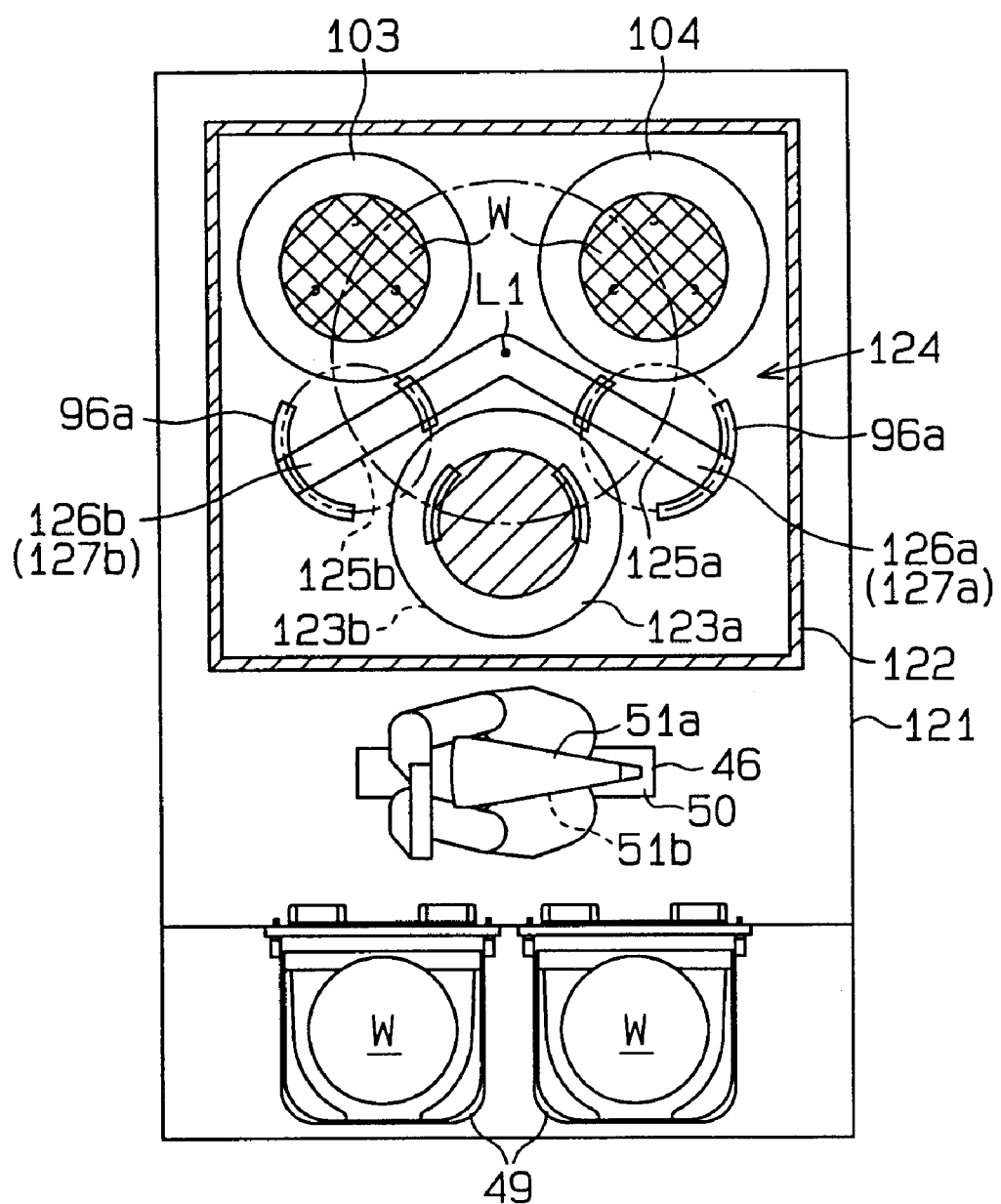
FIG. 25 is a plan view showing a semiconductor manufacturing apparatus according to a fifth embodiment of this invention.

As shown in FIG. 25, the semiconductor manufacturing apparatus 121 has a vacuum transfer chamber 122, two process chambers 103 and 104 and two load-lock (L/L) chambers 123a and 123b. The semiconductor manufacturing apparatus 121 further has an internal transfer robot 124 and an external transfer robot 46. Those individual chambers allow the semiconductor manufacturing apparatus 121 to simultaneously process two wafers W.

The vacuum transfer chamber 122 has a square shape in a horizontal cross-section. The internal transfer robot 124 is located in the vacuum transfer chamber 122. The internal transfer robot 124 has first and second internal transfer arms 125a and 125b bent at right angles. The first and second internal transfer arms 125a and 125b are arranged apart vertically from each other. The first and second internal transfer arms 125a and 125b are rotatable on a horizontal plane about an axis L1 positioned in the center of the vacuum transfer chamber 122 and are movable vertically along the axis L1 (see FIG. 6).

The first internal transfer arm 125a has first and second hand sections 126a and 126b for holding a plurality of wafers W (two in this embodiment). The first hand section 126a, like the internal transfer arm 95a of the third embodiment, is provided with first and second holding pieces 96a and 96b. Likewise, the second hand section 126b is provided with first and second holding pieces 96a and 96b.

Likewise, the second internal transfer arm 125b has first and second hand sections 127a and 127b for holding a plurality of wafers W (two in this embodiment). Each of those hand sections 127a and 127b is provided with first and second holding pieces 96a and 96b.

The process chambers 103 and 104 and the L/L chambers 123a and 123b are arranged at intervals of 120 degrees on the rotational locus of the internal transfer arms 125a and 125b indicated by a dotted line. The process chambers 103 and 104 have the same structures as the process chamber 43 in the third embodiment. The process chambers 103 and 104 are symmetrical to each other with respect to an imaginary plane perpendicular to FIG. 25 and including the axis L1. The same process is performed on wafers W in both chambers 103 and 104.

Figure 26:
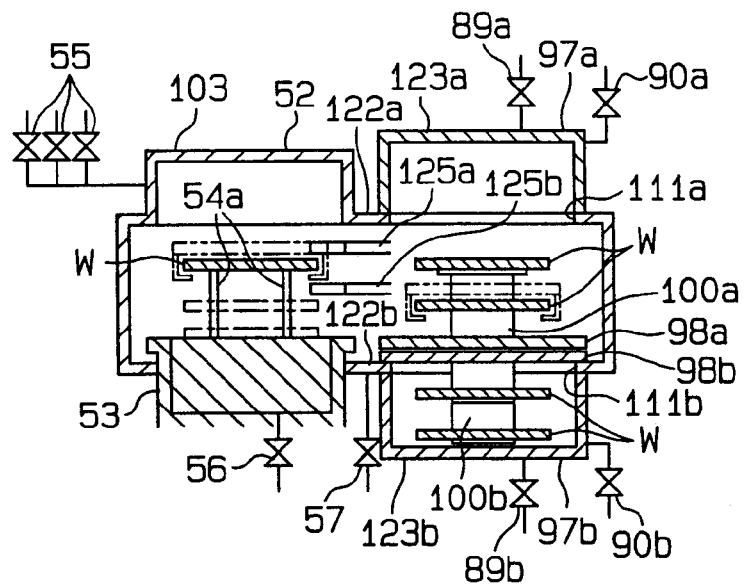
FIG. 26 is a side cross-sectional view depicting a load-lock chamber and a process chamber of the apparatus in FIG. 25.
Figure 27:
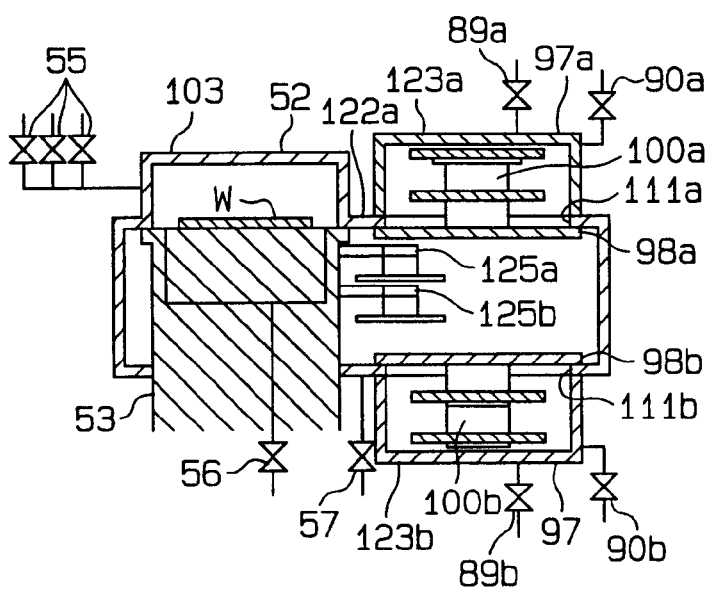
FIG. 27 is another side cross-sectional view depicting the load-lock chamber and the process chamber of the apparatus in FIG. 25.

The L/L chambers 123a and 123b have the same structures as the first and second L/L chambers 93a and 93b in the third embodiment. As shown in FIGS. 26 and 27, the L/L chamber 123a is located directly above the L/L chamber 123b.

FIG. 26 shows a wafer W being directly transferable between the process chamber 103 and the L/L chamber 123b. FIG. 27 shows the process chamber 103 and the L/L chambers 123a and 123b. As the process chamber 104 is symmetrical to the process chamber 103, the illustration of the process chamber 104 is omitted.

The first hand sections 126a and 127a and the second hand sections 126b and 127b of the first and second internal transfer arms 125a and 125b are arranged at angles of 120 degrees therebetween. Therefore, each of the first and second internal transfer arms 125a and 125b can simultaneously hold, transfer two wafers W to the adjoining two locations and unload them. Specifically, the first internal transfer arm 125a holds the processed wafer W in the process chamber 103 (or 104) and the upper unprocessed wafer W on the wafer holder 100a (or 10b), and the second internal transfer arm 125b holds the processed wafer W in the process chamber 104 (or 103) and the lower unprocessed wafer W on the wafer holder 100a (or 100b).

The internal transfer robot 124 simultaneously transfers two wafers W between the process chambers 103 and 104 and the L/L chamber 123a (or 123b) merely by the rotational and vertical movements of the internal transfer arms 125a and 125b, as per the fourth embodiment.

Unlike the conventional internal transfer robots 20 and 32 (see FIGS. 1 and 3), the whole internal transfer robot 124 of the fifth embodiment need not be rotated. Since the internal transfer arms 125a and 125b do not have a plurality of joints, they are easily controlled.

In the semiconductor manufacturing apparatus 121 of the fifth embodiment, like that of the third embodiment, wafers W are directly transferred between the L/L chambers 123a and 123 b and the process chambers 103 and 104. Therefore, the centers of the process chamber 103 and 104 and the L/L chambers 123a and 123b lie on the rotational locus of the wafers W to be transferred by the arms 125a and 125b. In the semiconductor manufacturing apparatus 121, there is no buffer area in the vacuum transfer chamber 122 and the wafers W are directly transferred between the L/L chambers 123a and 123b and the process chambers 103 and 104. Therefore, the distances between the process chambers 103 and 104 and the L/L chambers 123a and 123b are shorter than those in the first and second embodiments, and the vacuum transfer chamber 122 is smaller than those of the first and second embodiments.

The transfer operation of the internal transfer robot 124 in the semiconductor manufacturing apparatus 121 will be discussed below.

Figure 28A:
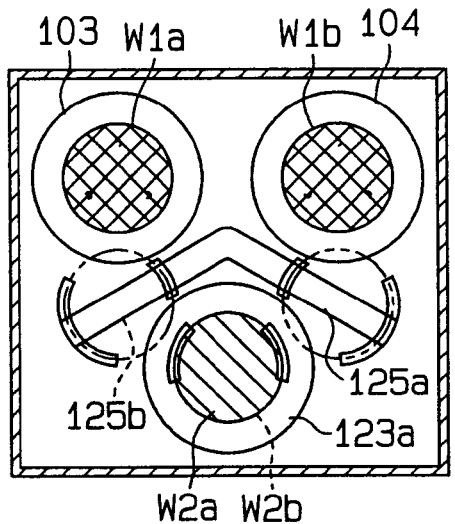
FIGS. 28A to 28D are plan views illustrating the movements of internal transfer arms of the apparatus in FIG. 25.

FIGS. 28A to 28D illustrate the sequence in which the internal transfer arms 125a and 125b exchange processed wafers W retained in the process chambers 103 and 104 with two unprocessed wafers W in the L/L chamber 123a. In FIG. 28A, a single processed wafer W1a or W1b is held by the lift pin 54a in each of the process chambers 103 and 104, and two unprocessed wafers W2a and W2b are held by the wafer holder 100a in the L/L chamber 123a.

The computer 71 causes the apparatus 121 to exchange a processed wafer W1 with an unprocessed wafer W2 according to the following steps (51) to (53).

Figure 28B:
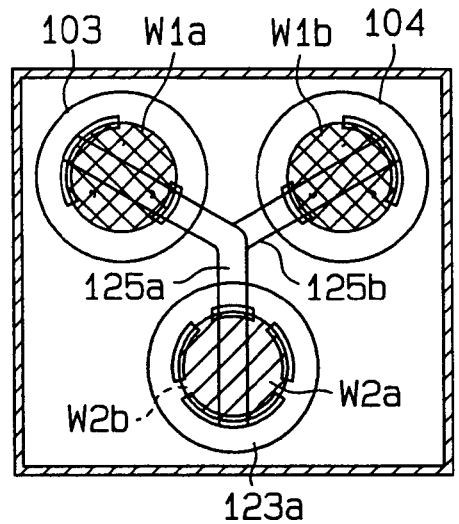

(51) The computer 71 moves the process-chamber stages 53 in the process chambers 103 and 104 down to the transfer position in FIG. 26. Then, the computer 71 rotates the first internal transfer arm 125a clockwise. This causes the second hand section 126b to move to an exchange position where it will hold the wafer W1a in the first process chamber 103. At the same time, the computer 71 rotates the second internal transfer arm 125b counterclockwise. This causes the first hand section 127a to move to an exchange position where it will hold the wafer W1b in the second process chamber 104 (FIGS. 28A and 28B).

Figure 28C:
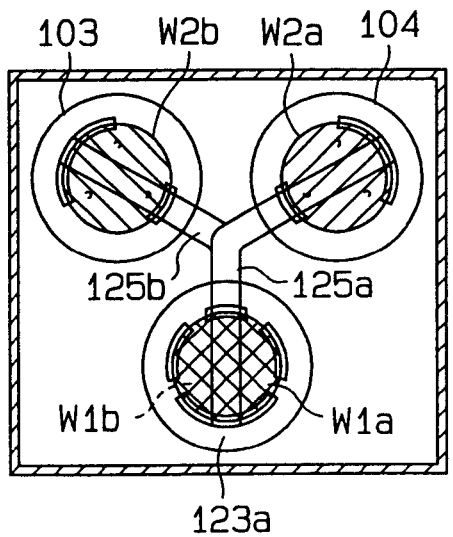

(52) As shown in FIG. 28C, the computer 71 simultaneously drives the first and second internal transfer arms 125a and 125b to exchange the wafers W1a and W1b in the process chambers 103 and 104 with the unprocessed wafers W2a and W2b. Specifically, the computer 71 lifts the first and second internal transfer arms 125a and 125b to hold the processed wafers W1a and W1b and the unprocessed wafers W2a and W2b. Next, the computer 71 rotates the first internal transfer arm 125a counterclockwise by 120 degrees and rotates the second internal transfer arm 125b clockwise by 120 degrees. This causes the processed wafers W1a and W1b to be transferred to the L/L chamber 123a and causes the unprocessed wafers W2a and W2b to be respectively transferred to the process chambers 104 and 103.

Figure 28D:
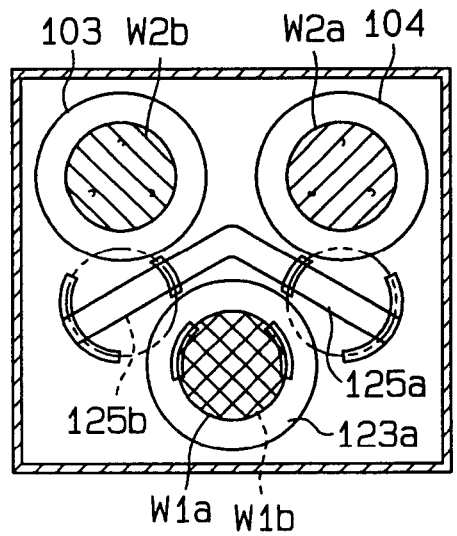

(53) The computer 71 moves the first and second internal transfer arms 125a and 125b down to place the unprocessed wafers W2a and W2b respectively on the lift pins 54a in the process chambers 103 and 104 and the processed wafers W1a and W1b on the upper wafer holder 100a in the upper L/L chamber 123a. Thereafter, the computer 71 rotates the first and second internal transfer arms 125a and 125b to a standby position where the arms do not interfere with the process chambers 103 and 104 and the L/L chambers 123a and 123b (FIG. 28D).

Through the above steps, the computer 71 exchanges the processed wafers W1a and W1b in the process chambers 103 and 104 with the unprocessed wafers W2a and W2b in the L/L chamber 123a. Thereafter, the computer 71 lifts the process-chamber stage 53 to close the process chambers 103 and 104. In the closed process chambers 103 and 104, wafer processing is performed on the unprocessed wafers W2a and W2b according to the recipes. By simultaneously processing two wafers in this manner, the system throughput is increased.

Because the operation for directly exchanging the processed wafers W in the process chambers 103 and 104 with two unprocessed wafers W in the L/L chamber 123b is the same as the above-described exchange operation involving the L/L chamber 123a, its description will be omitted.

The fifth embodiment has the following advantage in addition to the advantages of the first to fourth embodiments.

(1) The holding sections 10a and 100b which can simultaneously hold two wafers W are provided in the L/L chambers 123a and 123b. The internal transfer robot 124 can simultaneously transfer two wafers W to the process chambers 103 and 104 from the L/L chamber 123a (or 123b) by the rotational and vertical movements of the internal transfer arms 125a and 125b. This improves the transfer time per wafer, thus resulting in improved throughput.

Sixth Embodiment

A semiconductor manufacturing apparatus 131 according to a sixth embodiment will be described below with reference to FIGS. 29 to 31.

Figure 29:
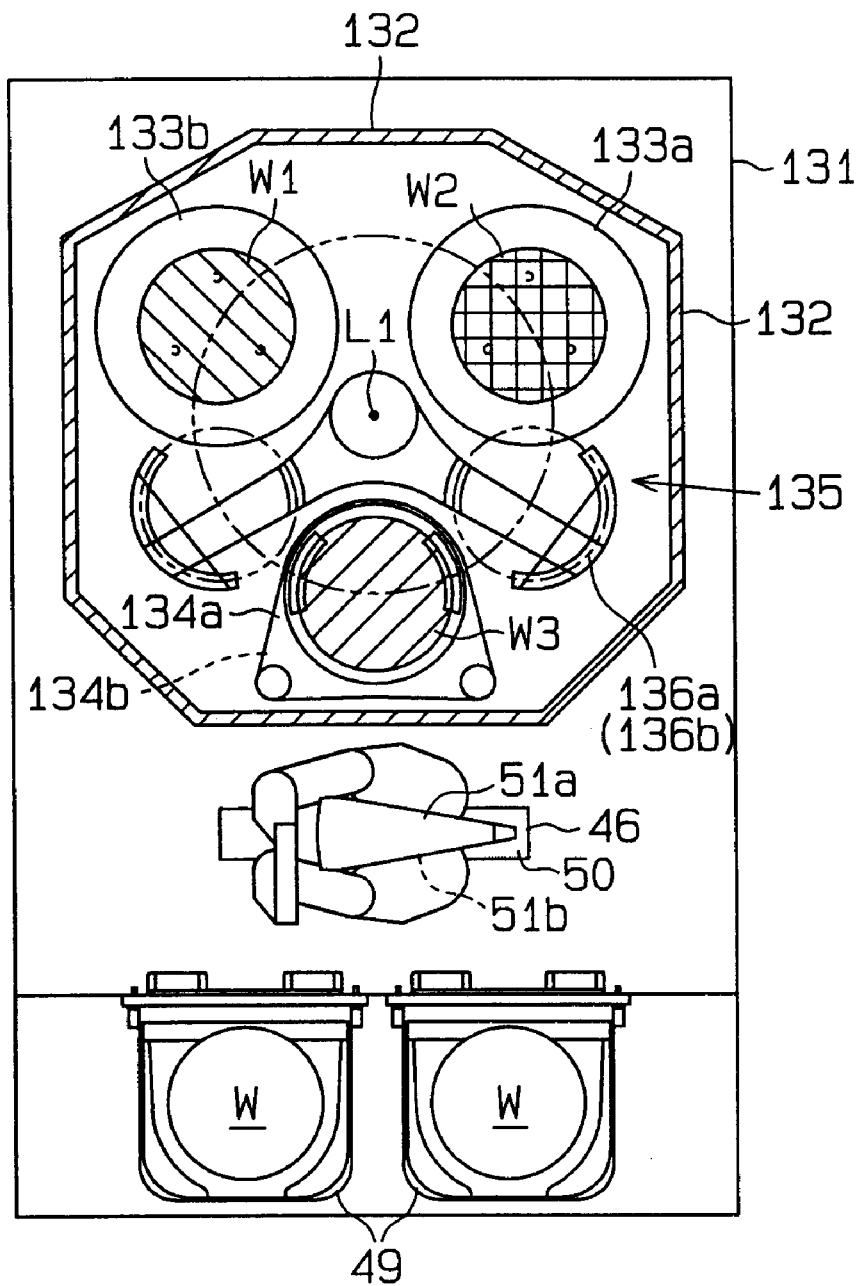
FIG. 29 is a plan view showing a semiconductor manufacturing apparatus according to a sixth embodiment of this invention.

As shown in FIG. 29, the semiconductor manufacturing apparatus 131 has a vacuum transfer chamber 132, two process chambers 133a and 133b and two load-lock (L/L) chambers 134a and 134b. The semiconductor manufacturing apparatus 131 can simultaneously perform processes on two wafers W. The semiconductor manufacturing apparatus 131 further has an internal transfer robot 135 and an external transfer robot 46.

The vacuum transfer chamber 132 has an octagonal shape in a horizontal cross-section. The internal transfer robot 135 is located in the vacuum transfer chamber 132. The internal transfer robot 135 has two internal transfer arms 136a and 136b vertically arranged side by side. The internal transfer arms 136a and 136b are horizontally rotatable about an axis L1 extending vertically and are vertically movable along the axis L1 (see FIG. 6).

The process chambers 133a and 133b and the L/L chambers 134a and 134b are arranged at intervals of 120 degrees on the locus (one-dot chain line in FIG. 29) that is drawn by the centers of wafers W to be transferred by the internal transfer robot 135, as per the fifth embodiment. Further, the L/L chamber 134a is located directly above the L/L chamber 134b.

The process chamber 133a is similar to the process chamber 43 in the third embodiment. The process chamber 133b is symmetrical to the process chamber 133a with respect to an imaginary plane perpendicular to FIG. 29 and including the axis L1. Different processes are performed on wafers W in the respective process chambers 133a and 133b. Specifically, an unprocessed wafer W is subjected to a first process in the process chamber 133a and another unprocessed wafer W is subjected to a second process in the process chamber 133b.

The same process may be performed on wafers W in the first and second process chambers 133a and 133b. In this case, the time for processing the wafer W in each of the first and second process chambers 133a and 133b is a half of the time needed for the previous case.

The L/L chambers 134a and 134b, like those of the fifth embodiment, respectively have wafer holders 100a and 100b each capable of holding two wafers W. Each of the L/L chambers 134a and 134b has the minimum inside diameter needed to retain a wafer W. The inside diameter of each of upper and lower hatches 97a and 97b and first and second passages 111a and 111b is equal to the inside diameter of each of the L/L chambers 134a and 134b. The outside diameters of upper and lower stages 98a and 98b are set to correspond to that inside diameter. The L/L chambers 134a and 134b of the sixth embodiment are therefore smaller than the L/L chambers of the above-described individual embodiments.

The site area or footprint of the L/L chambers 134a and 134b is thus smaller than that of the process chambers 133a and 133b. The distances between the L/L chambers 134a and 134b and the first and second process chambers 133a and 133b are therefore shorter than those in the above-described individual embodiments. That is, the rotational radius of the internal transfer arms 136a and 136b in the sixth embodiment is smaller than that in each of the above-described individual embodiments. This makes the footprint of the vacuum transfer chamber 132 smaller than that of the vacuum transfer chamber in each of the individual embodiments.

The first internal transfer arm 136a has first and second hand sections 137a and 137b. The first hand section 137a, like that of the internal transfer arm 95a of the third embodiment, is provided with first and second holding pieces 96a and 96b. Likewise, the second hand section 137b is provided with first and second holding pieces 96a and 96b. With this structure, the first internal transfer arm 136a holds two wafers W. Likewise, the second internal transfer arm 136b has first and second hand sections 138a and 138b each of which is provided with first and second holding pieces 96a and 96b. With this structure, the second internal transfer arm 136b also holds two wafers W. The shapes of the internal transfer arms 136a and 136b are determined in such a way as not to interfere with the process chambers 133a and 133b and the L/L chambers 134a and 134b.

The first hand sections 137a and 138a and the second hand sections 137b and 138b of the first and second internal transfer arms 136a and 136b are arranged at angles of 120 degrees therebetween so that the first and second internal transfer arms 136a and 136b can simultaneously hold two wafers W located in adjoining two of the process chambers 133a and 133b and the L/L chamber 134a (134b), and simultaneously transfer and unload them. The first internal transfer arm 136a holds the processed wafer W in the process chamber 133a (or 133b) and the upper unprocessed wafer W on the wafer holder 100a (or 100b), and the second internal transfer arm 136b holds the processed wafer W in the process chamber 133b (or 133a) and the lower unprocessed wafer W on the wafer holder 100b (or 100b).

The internal transfer robot 135 simultaneously transfers two wafers W between the process chambers 133a and 133b and the L/L chamber 134a (or 134b) merely by the rotational and vertical movements of the internal transfer arms 136a and 136b, as per the fourth embodiment.

Unlike the conventional internal transfer robots 20 and 32 (see FIGS. 1 and 3), the whole internal transfer robot 135 need not be rotated. As the internal transfer arms 136a and 136b do not have a plurality of joints, they are easily controlled.

In the semiconductor manufacturing apparatus 131, like that of the third embodiment, there is no buffer area for temporarily retaining a wafer W and wafers W are directly transferred between the L/L chambers 134a and 134b and the process chambers 133a and 133b.

The transfer operation of the internal transfer robot 135 will now be discussed with reference to FIGS. 30A to 30D.

In FIGS. 30A to 30D, the internal transfer arms 136a and 136b perform a series transfer of wafers W. In the series transfer, the wafer W in the process chamber 133a is transferred to the process chamber 133b, the wafer W in the process chamber 133b is transferred to the L/L chamber 134a (or 134b), and the wafer W in the L/L chamber 134a (or 134b) is transferred to the process chamber 133a.

Figure 30A:
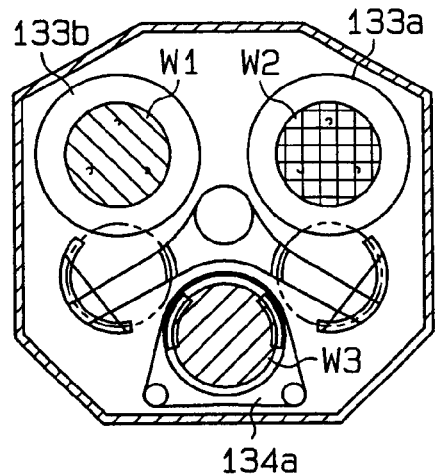
FIGS. 30A to 30D are schematic plan views illustrating the movements of internal transfer arms of the apparatus in FIG. 29.

In FIG. 30A, a processed wafer W1 which has undergone first and second processes is held in the process chamber 133b, a processed wafer W2 which has undergone only the first process is held in the process chamber 133a, and an unprocessed wafer W3 is held in the first L/L chamber 134a.

The computer 71 transfers wafers W based on recipes for the series transfer, which are stored in the memory device 74. In this series transfer, the individual wafers W1–W3 are transferred to the next positions according to the following steps (61) to (63).

Figure 30B:
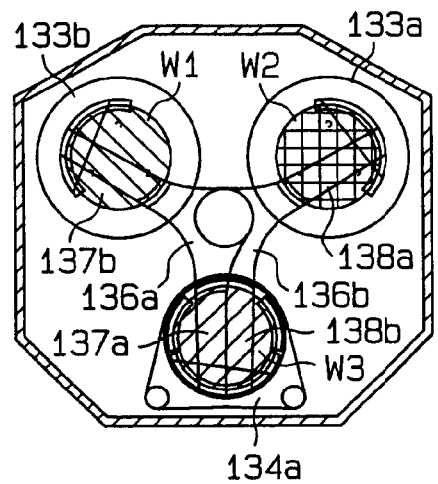

(61) The computer 71 moves the process-chamber stages 53 in the process chambers 133a and 133b down to the transfer position. The computer 71 then rotates the first internal transfer arm 136a of the internal transfer robot 135 clockwise to an exchange position where the second hand section 137b will hold a wafer W1a in the first process chamber 133a, and rotates the second internal transfer arm 136b counterclockwise to an exchange position where the first hand section 138a will hold a wafer W1b in the second process chamber 133b (FIGS. 30A and 30B).

Figure 30C:
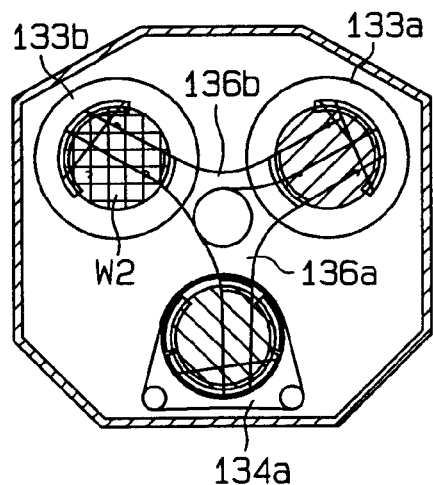

(62) As shown in FIG. 30C, the computer 71 simultaneously drives the first and second internal transfer arms 136a and 136b to perform the series transfer of the wafers W1–W3. Specifically, the computer 71 lifts the first and second internal transfer arms 136a and 136b to hold the individual wafers W1–W3. Then, the computer 71 simultaneously rotates the first and second internal transfer arms 136a and 136b counterclockwise by 120 degrees. This causes the processed wafer W1 to be transferred to the L/L chamber 134a, the wafer W2 undergoing processing to be transferred to the second process chamber 133b and the unprocessed wafer W3 to be transferred to the first process chamber 133a.

Figure 30D:
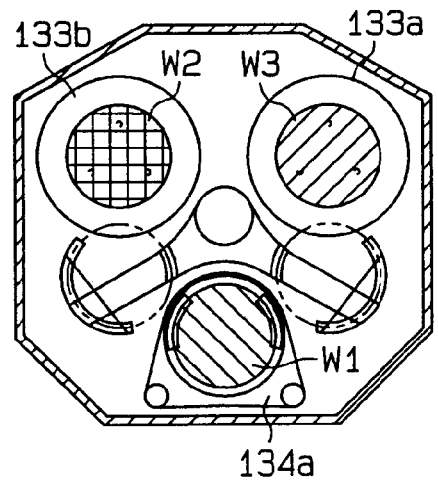

(63) The computer 71 moves the first and second internal transfer arms 136a and 136b down and respectively unloads the wafers W1–W3 into the L/L chamber 134a, the second process chamber 133b and the first process chamber 133a. Thereafter, the computer 71 rotates the first and second internal transfer arms 136a and 136b to a standby position where the arms do not interfere with the process chambers 133a and 133b and the first and second L/L chambers 134a and 134b (FIG. 30D).

After the series transfer of the three wafers W1–W3, the computer 71 lifts the process-chamber stages 53 to close the process chambers 133a and 133b. In the closed process chambers 133a and 133b, first and second processes are respectively performed on the unprocessed wafers W3 and W2 according to the recipes.

The sixth embodiment performs the series transfer of two wafers and simultaneously performs two different processes on the respective wafers, thereby decreasing the processing time per wafer.

Because the operation for directly transferring wafers W to the second L/L chamber 134b from the process chamber 133b is the same as the operation of the series transfer involving the first L/L chamber 134a, its description will be omitted.

As shown in FIG. 31, processing recipes have a hierarchical structure including a plurality of upper-rank recipes R11 to R16 and a plurality of lower-rank recipes R21 to R24.

In the lower-rank recipes R21–R24 program codes are described for the processes which are performed on the wafers W in the process chambers 133a and 133b. In the upper-rank recipes R11–R16 program codes are described for process selection indicating which lower-rank recipe should be used for each of the process chambers 133a and 133b in FIG. 29, i.e., what kind of process should be carried out in each of the process chambers 133a and 133b. The computer 71 selects a transfer mode according to that of the lower-rank recipes R21–R24 which is registered in the selected one of the upper-rank recipes R11–R16.

There are two transfer modes, namely "simultaneous transfer mode" and "series transfer mode". The simultaneous transfer mode is for exchanging two wafers W retained in the first L/L chamber 134a (or the second L/L chamber 134b) with processed wafers W in the process chambers 133a and 133b, as in the transfer sequence of the fifth embodiment. The series transfer mode is the transfer sequence of this embodiment.

The computer 71 selects one of the upper-rank recipes R11-R16 in accordance with the instruction input by an operator using the input device 73. Then, the computer 71 controls the process chambers 133a and 133b, the L/L chambers 134a and 134b and the internal transfer robot 135 according to the program codes of that lower-rank recipe which is registered in the selected upper-rank recipe. "Process chamber 1" indicates the first process chamber 133a, and "process chamber 2" indicates the second process chamber 133b. In this example, the upper-rank recipe R11 indicates that processing is to be carried out in the "process chamber 1" and "process chamber 2" according to a "recipe 1" described in the lower-rank recipe R21.

If the upper-rank recipe R11 is selected, for example, the computer 71 simultaneously performs the same process on two wafers W in both process chambers 133a and 133b. In this case, because processing is completed at the same time in both process chambers 133a and 133b, those two wafers W should be transferred to the first L/L chamber 134a (or the second L/L chamber 134b). In this case, the mode becomes the "simultaneous transfer mode" so that the computer 71 transfers wafers W according to the transfer sequence shown in FIGS. 28A–28D.

If the upper-rank recipe R12 is selected as another case, the computer 71 performs a process on one wafer W in the first process chamber 133a according to the lower-rank recipe R21 and performs a process on the other wafer W in the second process chamber 133b according to the lower-rank recipe R22. As the lower-rank recipe R21 differs from the lower-rank recipe R22, different processes are executed in the process chambers 133a and 133b, respectively.

When the upper-rank recipe R12 is selected, the mode becomes the "series transfer mode" so that the computer 71 transfers wafers W according to the transfer sequence shown in FIGS. 30A–30D.

As apparent from the above, as the transfer mode corresponding to the process registered in each of the upper-rank recipes R11–R16 is automatically selected, it is unnecessary to perform an input operation to alter the transfer mode. This results in an improved working efficiency.

The sixth embodiment has the following advantage in addition to the advantages of the above-described embodiments.

(1) In the semiconductor manufacturing apparatus 131, the site area of the L/L chambers 134a and 134b is smaller than that of the process chambers 133a and 133b. This shortens the distances between the L/L chambers 134a and 134b and the first and second process chambers 133a and 133b. That is, the rotational radius of the internal transfer arms 136a and 136b in this embodiment is smaller than that in each of the above-described individual embodiments. This can make the site area of the vacuum transfer chamber 132 smaller.

(2) The semiconductor manufacturing apparatus 131 can perform the series transfer of wafers using the internal transfer arms 136a and 136b. This allows two different processes to be simultaneously performed on different wafers, thus shortening the processing time per wafer.

(3) The storage device 74 pre-stores a plurality of the upper-rank recipes R11–R16 and lower-rank recipes R21–R24. The transfer mode for wafers W is changed in accordance with that of the lower-rank recipes R21–R24 which is described in the selected upper-rank recipe. This eliminates the need for any input operation to alter the transfer mode according to the process, so that the working efficiency is improved.

Seventh Embodiment

A semiconductor manufacturing apparatus 141 according to a seventh embodiment will be described below with reference to FIGS. 32 to 37.

Figure 32:
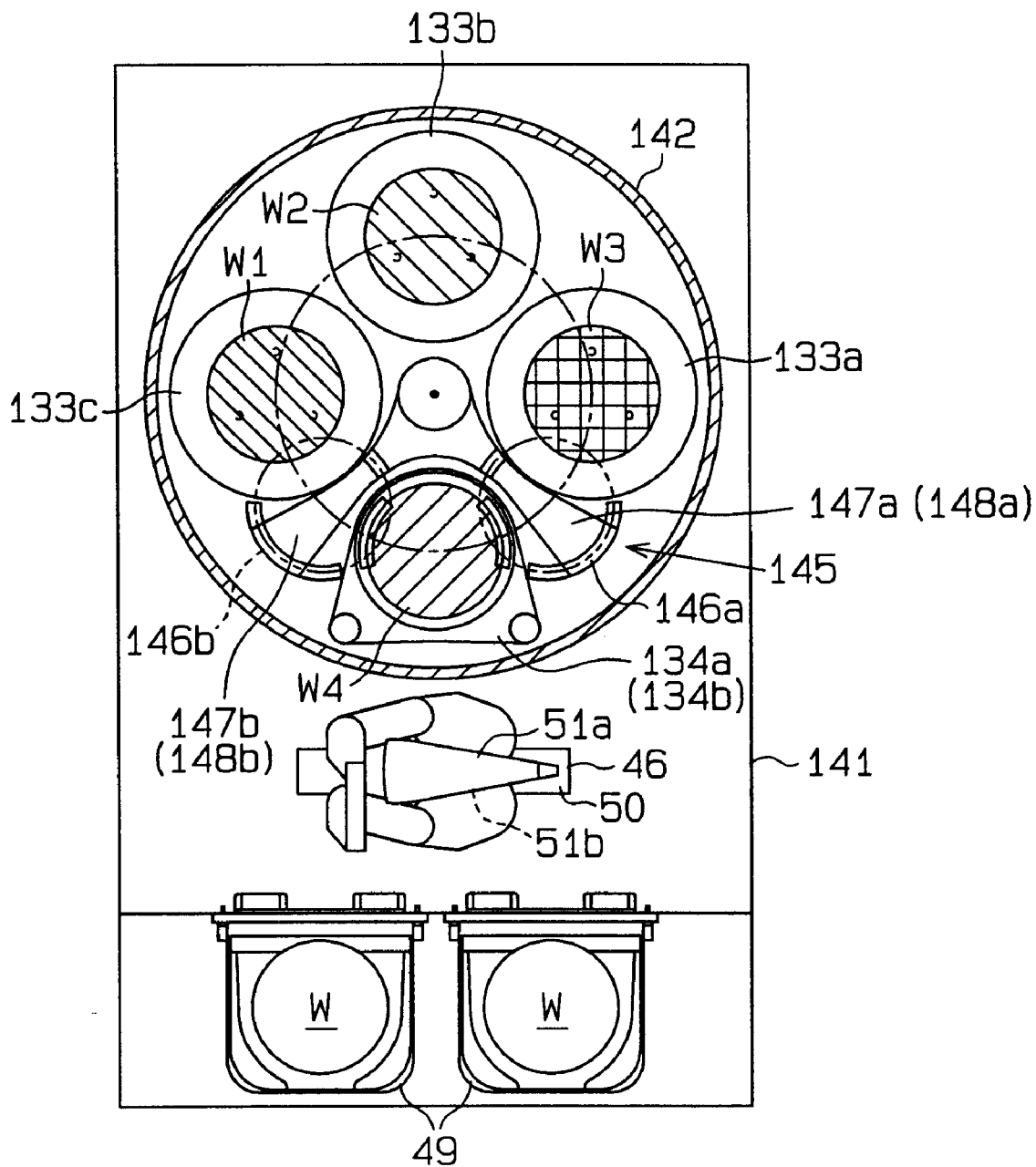
FIG. 32 is a plan view showing a semiconductor manufacturing apparatus according to a seventh embodiment of this invention.

As shown in FIG. 32, the semiconductor manufacturing apparatus 141 has a vacuum transfer chamber 142, three process chambers 133a, 133b and 133c and two load-lock (L/L) chambers 134a and 134b. The semiconductor manufacturing apparatus 141 further has an internal transfer robot 145 and an external transfer robot 46.

The vacuum transfer chamber 142 has a circular shape in a horizontal cross-section. The internal transfer robot 145 is located in the vacuum transfer chamber 142. The internal transfer robot 145 has two internal transfer arms 146a and 146b vertically arranged in parallel to each other. The internal transfer arms 146a and 146b are horizontally rotatable about an axis L1 extending vertically and are movable along the axis L1 (see FIG. 6).

The process chambers 133a–133c and the first L/L chamber 134a are arranged at intervals of 90 degrees on the locus (one-dot chain line in FIG. 32) that is drawn by the centers of wafers W to be transferred by the internal transfer robot 145, as per the fifth embodiment. Further, the L/L chamber 134a is located directly above the L/L chamber 134b.

The process chambers 133a–133c are constructed in the same way as the process chamber 43 in the third embodiment. Different processes can be performed on wafers W in the respective process chambers 133a–133c. For example, an unprocessed wafer can be subjected to a first process in the process chamber 133a, another unprocessed wafer can be subjected to a second process in the process chamber 133b and a different unprocessed wafer can be subjected to a third process in the process chamber 133c.

The same process may be performed on wafers W in the first to third process chambers 133a–133c. In this case, the time for processing the wafer W in each of the first to third process chambers 133a–133c is one third of the time needed for the previous case.

The internal transfer arms 146a and 146b are designed in such shapes so as not to interfere with the process chambers 133a–133c and the L/L chambers 134a and 134b. The first internal transfer arm 146a has first and second hand sections 147a and 147b. The first hand section 147a, like that of the internal transfer arm 95a of the third embodiment, is provided with first and second holding pieces 96a and 96b. Likewise, the second hand section 147b is provided with first and second holding pieces 96a and 96b. The first internal transfer arm 146a holds two wafers W.

Likewise, the second internal transfer arm 146b has first and second hand sections 148a and 148b each of which is provided with first and second holding pieces 96a and 96b. With this structure, the second internal transfer arm 146b holds two wafers W.

The first and second internal transfer arms 146a and 146b can simultaneously hold two wafers W located in adjoining two of the process chambers 133a–133c and the L/L chamber 134a (134b), and simultaneously transfer and unload them. The internal transfer robot 145 simultaneously transfers two wafers W between the process chambers 133a–133c and the L/L chamber 134a (or 134b) merely by the rotational and vertical movements of the internal transfer arms 146a and 146b, as per the fourth embodiment.

Unlike the conventional internal transfer robots 20 and 32 (see FIGS. 1 and 3), therefore, the whole internal transfer robot 145 of the seventh embodiment need not be rotated. As the internal transfer arms 146a and 146b do not have a plurality of joints, they are easily controlled.

In the semiconductor manufacturing apparatus 141 of the seventh embodiment, like that of the third embodiment, wafers W are directly transferred between the L/L chambers 134a and 134b and the process chambers 133a–133c.

The transfer operation of the internal transfer robot 145 in the semiconductor manufacturing apparatus 141 will now be discussed with reference to FIGS. 35A to 35D.

In FIGS. 35A to 35D, the internal transfer arms 146a and 146b perform a series transfer of wafers W. To describe specifically, the wafers W in the process chambers 133a and 133b are respectively transferred to the process chambers 133b and 133c, the wafer W in the process chamber 133c is transferred to the L/L chamber 134a (or 134b), and the wafer W in the L/L chamber 134a (or 134b) is transferred to the process chamber 133a. The computer 71 transfers wafers W based on recipes for the series transfer, which are stored in the memory device 74.

Figure 35A:
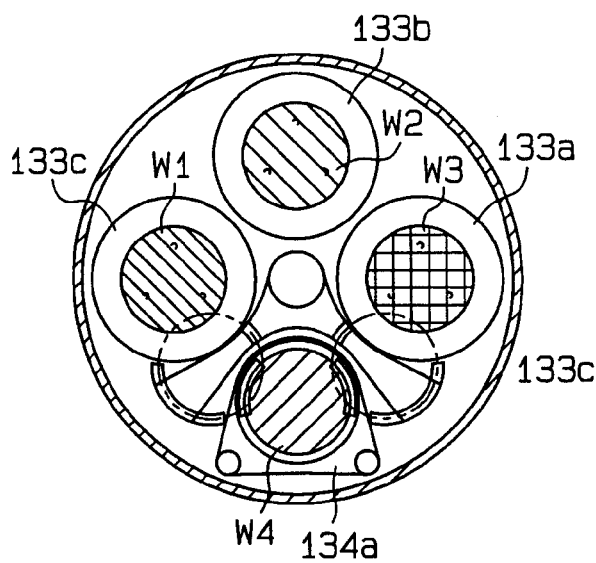
FIGS. 35A to 35D are plan views illustrating the movements of internal transfer arms of the apparatus in FIG. 32.

In FIG. 35A, a processed wafer W1 which has undergone first to third processes is held in the process chamber 133c, a processed wafer W2 which has undergone the first and second processes is held in the process chamber 133b, and a processed wafer W3 which has undergone only the first process is held in the process chamber 133a. An unprocessed wafer W4 is held in the first L/L chamber 134a.

Based on the processing recipes, the computer 71 transfers the individual wafers W1–W4 to the next positions according to the following steps (71) to (73).

Figure 33:
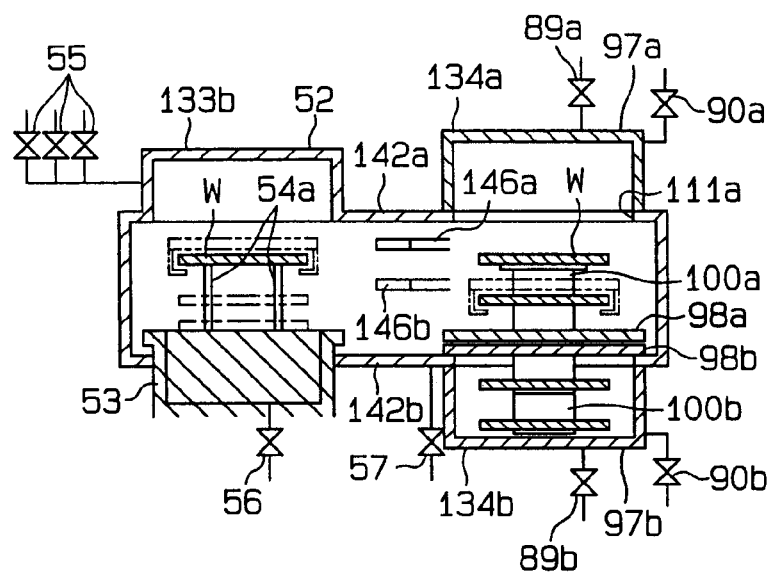
FIG. 33 is a side cross-sectional view depicting a load-lock chamber and a process chamber of the apparatus in FIG. 32.
Figure 34:
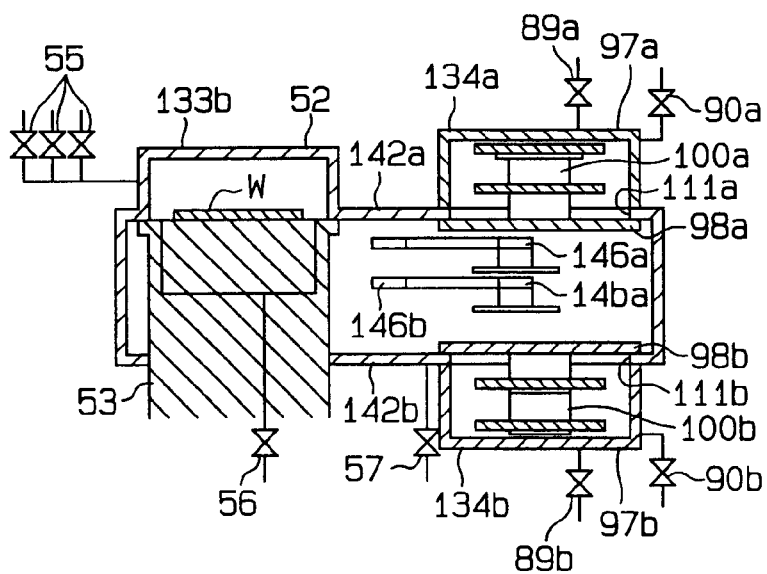
FIG. 34 is another side cross-sectional view depicting the load-lock chamber and the process chamber of the apparatus in FIG. 32.
Figure 35B:
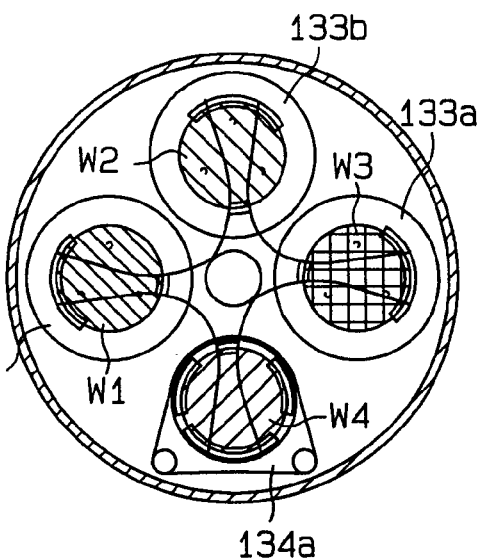
Figure 35C:
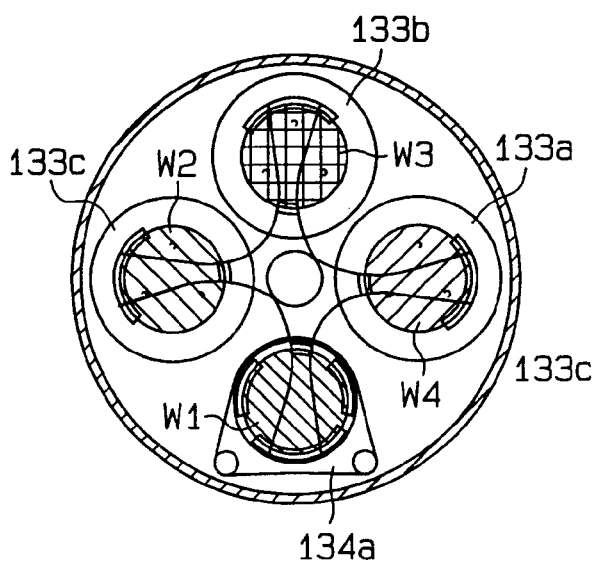
Figure 35D:
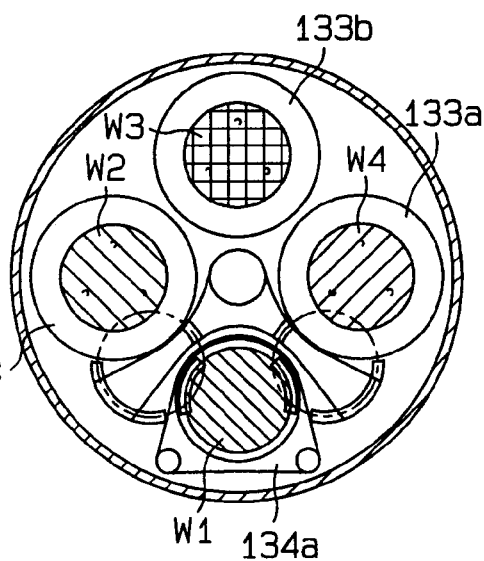

(71) The computer 71 moves the process-chamber stages 53 in the process chambers 133a–133c down to the transfer position shown in FIG. 33. Next, the computer 71 rotates the first internal transfer arm 146a counterclockwise to an exchange position by 135 degrees. This rotation causes the first and second hand sections 147a and 147b to respectively reach under the wafers W2 and W3 in the first and second process chambers 133a and 133b. At the same time, the computer 71 rotates the second internal transfer arm 146b clockwise by 45 degrees. This rotation causes the first and second hand sections 148a and 148b to respectively reach under the wafer W4 in the first L/L chamber 134a and the wafer W1 in the third process chamber 133c (FIG. 35B).

(72) The computer 71 lifts the first and second internal transfer arms 146a and 146b in order to hold the wafers W1–W4. Then, the computer 71 simultaneously rotates the first and second internal transfer arms 146a and 146b counterclockwise by 90 degrees. This causes the processed wafer W1 to be transferred to the L/L chamber 134a, the wafers W2 and W3 undergoing processing to be transferred to the third and second process chambers 133c and 133b and the unprocessed wafer W4 to be transferred to the first process chamber 133a.

(73) The computer 71 moves the first and second internal transfer arms 146a and 146b down. As a result, the individual wafers W1–W4 are unloaded into the L/L chamber 134a and the third to first process chamber 133c–133a. Thereafter, the computer 71 rotates the first and second internal transfer arms 146a and 146b to a standby position shown in FIG. 35D. At this standby position, the first and second internal transfer arms 146a and 146b do not interfere with the process chambers 133a–133c and the first and second L/L chambers 134a and 134b.

After the series transfer of the four wafers W1–W4 is carried out in the above manner, the computer 71 lifts the process-chamber stages 53 to close the process chambers 133a133c. In the closed process chambers 133a–133c, first to third processes are respectively performed on the unprocessed wafers W4–W2. As the series transfer of four wafers is performed and three different wafer processes are simultaneously performed, the processing time per wafer becomes shorter.

Because the operation for directly transferring processed wafers W to the second L/L chamber 134b from the third process chamber 133c is the same as the operation of the series transfer involving the first L/L chamber 134a, its description will be omitted.

The transfer sequence of the semiconductor manufacturing apparatus 141 will now be described. FIG. 36A shows the transfer sequence of the semiconductor manufacturing apparatus 121 of the fifth embodiment as a comparative example, and FIG. 36B shows the transfer sequence of the semiconductor manufacturing apparatus 131 of the sixth embodiment.

In the transfer sequence of the fifth embodiment, as shown in FIG. 36A, predetermined processes are performed on wafers W in the respective process chambers 103 and 104 in FIG. 25. In this transfer sequence, the processes on the individual wafers W are performed in a single step.

In the transfer sequence of the sixth embodiment, as shown in FIG. 36B, after the first process is performed on a wafer W, the flow is moved to the next process chamber where the second process is carried out.

In the transfer sequence of the seventh embodiment, as shown in FIG. 36C, the time for the first to third processes is the same as the time needed to prepare unprocessed wafer W in the L/L chambers 134a and 134b. That is, preparation of the unprocessed wafer W ends at the same time as each process ends. When preparation of an unprocessed wafer W is completed, the "Wf exchange step" can be carried out immediately.

Figure 37:
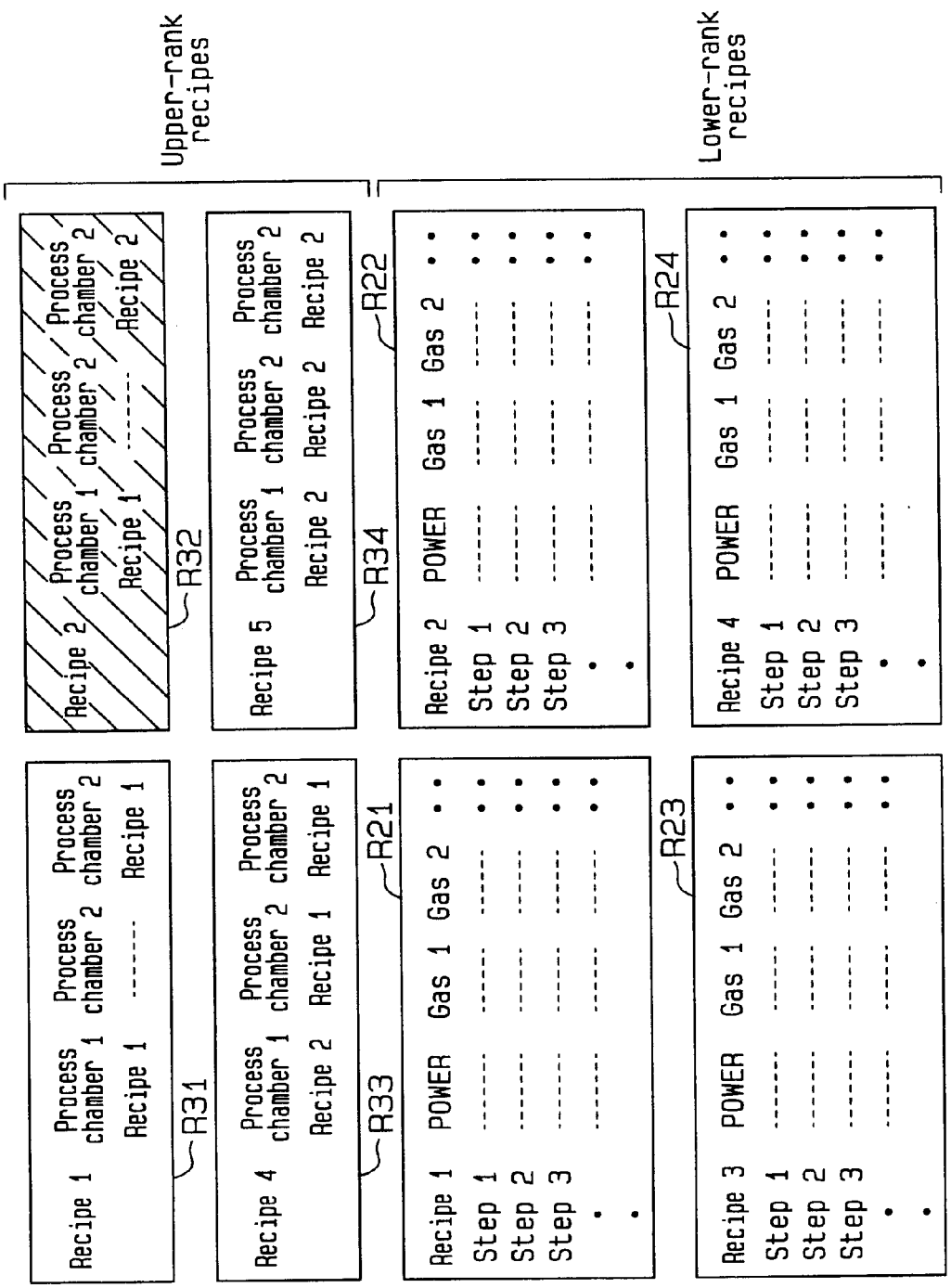
FIG. 37 shows processes performed by an apparatus of the present invention.

As shown in FIG. 37, processing recipes include a plurality of upper-rank recipes R31 to R34 and a plurality of lower-rank recipes R21 to R24.

In the lower-rank recipes R21–R24 are described program codes for the processes which are to be performed on the wafers W in the process chambers 133a–133c. In the upper-rank recipes R31–R34 are described program codes for process selection indicating what kind of process (lower-rank recipe) should be carried out in each of the process chambers 133a–133c in FIG. 32. The computer 71 selects a transfer mode according to that of the lower-rank recipes R21–R24 which is registered in the selected one of the upper-rank recipes R31–R34.

According to the seventh embodiment, a recipe which does not involve any process can be registered. As the semiconductor manufacturing apparatus 141 has three process chambers 133a–133c, registration of recipes is classified into the following six groups.

(A) Registration of three recipes.

(B) Registration of two recipes.

(B1) In the group (B), the second process chamber is not used and the processing condition is the same for the first and third process chambers.

(B2) In the group (B), the second process chamber is not used and the processing condition for the first process chamber differs from that for the third process chamber.

(B11) In the group (B), each processing time is longer than the period of the external transfer sequence.

(B12) In the group (B), each processing time is shorter than the period of the external transfer sequence.

The computer 71 selects the "simultaneous transfer mode" only in the case (B11) and selects the "series transfer mode" otherwise. When recipe registration is made as in the group (B11), the transfer sequence shown in FIG. 36A is executed.

When the mode is the simultaneous transfer mode, the computer 71 exchanges two wafers W retained in the first L/L chamber 134a (or the second L/L chamber 134b) with processed wafers W in the first and third process chambers 133a and 133c, as in the transfer sequence of the fifth embodiment.

The computer 71 selects one of the upper-rank recipes R31–R34 in accordance with the instruction input by an operator using the input device 73. Then, the computer 71 controls the process chambers 133a–133c, the L/L chambers 134a and 134b and the internal transfer robot 145 according to the program codes of that lower-rank recipe which is registered in the selected upper-rank recipe.

If the upper-rank recipe R32 is selected, for example, the computer 71 sets the second process chamber 133b unused according to the program codes described in the upper-rank recipe R32 and simultaneously performs the same process on two wafers W in first and third process chambers 133a and 133c according to the lower-rank recipe R21. In this case, because processing is completed at the same time in both process chambers 133a and 133c, those two wafers W should be transferred to the first L/L chamber 134a (or the second L/L chamber 134b). Therefore, the mode becomes the simultaneous transfer mode so that the computer 71 transfers wafers W in the same way as done in the transfer sequence shown in FIGS. 28A–28D.

If the upper-rank recipe R34 is selected as another case, the computer 71 performs a process on one wafer W in the first process chamber 133a according to the lower-rank recipe R21, performs a process on another wafer W in the second process chamber 133b according to the lower-rank recipe R22 and performs a process on the third wafer W in the third process chamber 133c according to the lower-rank recipe R23. In this case, different processes are performed on the wafers W in the respective process chambers 133a–133c. Then, the mode goes to the series transfer mode so that the computer 71 transfers wafers W according to the transfer sequence shown in FIGS. 35A–35D.

As apparent from the above, as the transfer mode corresponding to the process registered in each of the upper-rank recipes R31–R34 is automatically selected, it is unnecessary to perform an input operation to alter the transfer mode. This results in an improved working efficiency.

The seventh embodiment has the following advantage in addition to the advantages of the above-described embodiments.

(1) The semiconductor manufacturing apparatus 141 has three process chambers 133a–133c, and can simultaneously transfer four wafers W including those in the L/L chambers 134a and 134b using the internal transfer arms 146a and 146b. This results in a shorter processing time per wafer and improves the throughput.

The first to seventh embodiments may be modified as follows.

When the processing time in the semiconductor manufacturing apparatus 121 of the fifth embodiment is short, the series transfer in the sixth or seventh embodiment may be adapted.

In the first to seventh embodiments, each of the hatches 61, 85a, 85b, 97a and 97b of the individual L/L chambers 44, 84a, 84b, 93a, 93b 106a, 106b, 123a, 123b, 134a and 134b may be designed to have a movable portion to be able to transfer a wafer W.

Although a workpiece is a semiconductor wafer in the first to seventh embodiments, it may be a sapphire substrate or a glass substrate for use in an LCD, PDP or the like. In this case, the same operation and advantages of each embodiment can be acquired.

When processing in the process chamber does not require that the bottom surface of a wafer W should contact the process-chamber stage 53 in the first to seventh embodiments, the lift pin 54 need not be moved down. Further, the process-chamber stage 53 may be constructed in the same way as the L/L stage 62.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A transfer apparatus for transferring a plurality of workpieces, comprising:

a plurality of chambers arranged on a predetermined imaginary circle; and a transfer robot having a plurality of arms arranged hierarchically for respectively supporting the plurality of workpieces, the plurality of arms being independently rotatable along the imaginary circle and moveable upward and downward for transferring the plurality of workpieces between the plurality of chambers.

2. The transfer apparatus according to claim 1, wherein at least one of the chambers provides the associated workpiece to the associated arm from above the associated arm.

3. The transfer apparatus according to claim 1, wherein each of the arms has a holding piece for holding the associated workpiece.

4. The transfer apparatus according to claim 3, wherein the plurality of chambers includes three or more chambers, at least one of which has a holder for holding the plurality of workpieces, wherein the transfer robot substantially simultaneously transfers the plurality of workpieces from at least one chamber holding the plurality of workpieces to the other chambers, respectively, using the plurality of arms.

5. The transfer apparatus according to claim 4, wherein the transfer robot rotates the plurality of arms in the same rotational direction to simultaneously transfer the workpieces held in the chambers to next located in the rotational direction.

6. The transfer apparatus according to claim 4, wherein the transfer robot has a simultaneous transfer mode and a series transfer mode.

7. The transfer apparatus according to clam 1, wherein at least one of the chambers provides the associated workpiece to the associated arm from below the associated arm.

8. The transfer apparatus according to claim 1, wherein the predetermined imaginary circle is a rotational locus of the plurality of arms.

9. The transfer apparatus according to claim 1, wherein the transfer robot is vertically distanced from the chambers.

10. A workpiece processing apparatus for comprising:
   a transfer robot having a plurality of arms arranged hierarchically to hold a plurality of workpieces, the plurality of arms being independently rotatable and independently moveable upward and downward;
   a process chamber, arranged on a rotational locus of the plurality of arms, for performing a predetermined process on at least one workpiece;
   a pre-pressurizing chamber, arranged on the rotational locus of the plurality of arms, having a pressure changeable between an external pressure of the processing apparatus and an internal pressure of the processing apparatus; and
   a transfer chamber connecting the process chamber to the pre-pressurizing chamber,
   wherein the transfer robot transfers the plurality of workpieces between the process chamber, the pre-pressurizing chamber, and the transfer chamber.

11. The processing apparatus according to claim 10, wherein the pre-pressurizing chamber includes a plurality of pre-pressurizing chambers arranged hierarchically, each including a stage which moves upward and downward to supply the workpiece to an associated arm.

12. The processing apparatus according to claim 11, wherein the stage of at least one of the pre-pressurizing chamber supplies the workpiece to the associated arm from above.

13. The processing apparatus according to claim 11, wherein the stage of at least one of the pre-pressurizing chamber supplied the workpiece to the associated arm from below.

14. The processing apparatus according to claim 10, wherein each of the arms has a holding piece for holding an associated workpiece.

15. The processing apparatus according to claim 10, wherein the process chamber includes a plurality of process chambers;
   the pre-pressurizing chamber has a stage on which the plurality of workpieces are placed; and
   the transfer robot simultaneously transfers the plurality of workpieces placed on the stage to the plurality of process chambers.

16. The processing apparatus according to claim 10, wherein the process chamber includes a plurality of process chambers
   the pre-pressurizing chamber has a stage on which he plurality of workpieces are placed; and
   the transfer robot simultaneously transfers the plurality of workpieces placed on the stage to the plurality of process chambers.

17. The processing apparatus according to claim 10, wherein the process chamber includes a plurality of process chambers;
   the transfer robot has a simultaneous transfer mode and a series transfer mode;
   wherein in the simultaneously transfer mode, the plurality of workpieces held in the pre-pressurizing chamber are simultaneously transferred to the plurality of process chambers;
   in the series transfer mode, the plurality of workpieces held in the pre-pressurizing chamber and the plurality of process chambers are respectively transferred to next adjoining chambers; and
   the transfer robot selectively executes one of the simultaneous transfer mode and the series transfer mode.

18. The processing apparatus according to claim 10, wherein the transfer robot is located in the transfer chamber, and the process chamber and the pre-pressurizing chamber are arranged on at least one of an upper wall and a bottom wall of the transfer chamber.

19. The processing apparatus according to claim 10, wherein the at least one process chamber includes three process chamber, the plurality of arms includes first and second arms for respectively supporting a pair of the workpieces, and substantially simultaneously the first arm transfers a pair of the workpieces held in first adjoining chambers to second adjoining chambers, the second arm transfers a pair of the workpieces held in third adjoining chambers to fourth adjoining chambers.

* * * * *